(12) United States Patent
Choi et al.

(10) Patent No.: US 7,105,444 B2
(45) Date of Patent: Sep. 12, 2006

(54) METHOD FOR FORMING A WIRING OF A SEMICONDUCTOR DEVICE, METHOD FOR FORMING A METAL LAYER OF A SEMICONDUCTOR DEVICE AND APPARATUS FOR PERFORMING THE SAME

(75) Inventors: Kyung-In Choi, Seoul (KR); Sang-Bom Kang, Seoul (KR); Seong-Geon Park, Gyeonggi-do (KR); You-Kyoung Lee, Chungcheongbuk-do (KR); Gil-Heyun Choi, Gyeonggi-do (KR); Jong-Myeong Lee, Gyeonggi-do (KR); Sang-Woo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/857,253

(22) Filed: May 28, 2004

(65) Prior Publication Data

US 2005/0059240 A1    Mar. 17, 2005

Related U.S. Application Data

(63) Continuation-in-part of application No. 10/196,814, filed on Jul. 17, 2002, now abandoned, and a continuation-in-part of application No. 10/404,360, filed on Apr. 1, 2003, now Pat. No. 7,067,420, and a continuation-in-part of application No. 10/461,613, filed on Jun. 13, 2003, now Pat. No. 6,876,078.

(30) Foreign Application Priority Data

| Jul. 19, 2001 | (KR) | 2001-43526 |
| Mar. 29, 2002 | (KR) | 2002-17479 |
| May 21, 2002 | (KR) | 2002-28201 |
| Jun. 17, 2002 | (KR) | 2002-33635 |
| May 28, 2003 | (KR) | 10-2003-0033905 |

(51) Int. Cl.
    *H01L 21/44* (2006.01)

(52) U.S. Cl. ........... 438/685; 438/680; 438/653; 438/656; 438/681

(58) Field of Classification Search ........ 438/620, 438/627, 628, 629, 648, 650, 653, 656, 657, 438/685, 720, 737, 738; 257/E23.163, E21.463, 257/E21.168, E21.295
See application file for complete search history.

(56) References Cited

U.S. PATENT DOCUMENTS 5,612,254 A * 3/1997 Mu et al. .............. 438/634

(Continued)

FOREIGN PATENT DOCUMENTS

JP    2002-193981    8/2002

(Continued)

OTHER PUBLICATIONS

English language abstract of Korean Publication No. 2003-0009093.

(Continued)

*Primary Examiner*—George Fourson
*Assistant Examiner*—Julio J. Maldonado
(74) *Attorney, Agent, or Firm*—Marger Johnson & McCollom, P.C.

(57) ABSTRACT

In a method for forming a wiring of a semiconductor device using an atomic layer deposition, an insulating interlayer is formed on a substrate. Tantalum amine derivatives represented by a chemical formula $Ta(NR_1)(NR_2R_3)_3$ in which $R_1$, $R_2$ and $R_3$ represent H or $C_1$–$C_6$ alkyl group are introduced onto the insulating interlayer. A portion of the tantalum amine derivatives is chemisorbed on the insulating interlayer. The rest of tantalum amine derivatives non-chemisorbed on the insulating interlayer is removed from the insulating interlayer. A reacting gas is introduced onto the insulating interlayer. A ligand in the tantalum amine derivatives chemisorbed on the insulating interlayer is removed from the tantalum amine derivatives by a chemical reaction between the reacting gas and the ligand to form a solid material including tantalum nitride. The solid material is accumulated on the insulating interlayer through repeating the above processes to form a wiring.

53 Claims, 24 Drawing Sheets

U.S. PATENT DOCUMENTS

| | | | | |
|---|---|---|---|---|
| 5,668,054 | A | 9/1997 | Sun et al. | 438/681 |
| 6,153,519 | A | 11/2000 | Jain et al. | 438/653 |
| 6,355,492 | B1 * | 3/2002 | Tanaka et al. | 438/3 |
| 6,420,099 | B1 * | 7/2002 | Gutsche et al. | 430/318 |
| 6,485,988 | B1 * | 11/2002 | Ma et al. | 438/3 |
| 6,875,688 | B1 * | 4/2005 | America et al. | 438/638 |
| 6,893,953 | B1 * | 5/2005 | Hoshino et al. | 438/618 |
| 2002/0076490 | A1 * | 6/2002 | Chiang et al. | 427/248.1 |
| 2002/0104481 | A1 * | 8/2002 | Chiang et al. | 118/723 I |

FOREIGN PATENT DOCUMENTS

| | | |
|---|---|---|
| KR | 2003-9093 | 1/2003 |
| KR | 2003-0009093 | 1/2003 |

OTHER PUBLICATIONS

English language abstract for Korean Patent Publication No. 2003-9093.

English language abstract for Japanese Patent Publication No. 2002-19381.

* cited by examiner

METHOD FOR FORMING A WIRING OF A SEMICONDUCTOR DEVICE, METHOD FOR FORMING A METAL LAYER OF A SEMICONDUCTOR DEVICE AND APPARATUS FOR PERFORMING THE SAME

CROSS REFERENCE TO RELATED APPLICATIONS

This application is a Continuation-In-Part of U.S. patent application Ser. No. 10/196,814, entitled "METHODS OF FORMING METAL LAYERS USING METALLIC PRECURSORS", filed on Jul. 17, 2002 now abandoned, which claims priority from Korean Patent Application No. 2001-43526, entitled "METHODS OF FORMING METAL LAYERS USING METALLIC PRECURSORS", filed on Jul. 19, 2001 and 2002-17479, entitled "METHODS OF FORMING METAL LAYERS USING METALLIC PRECURSORS", filed on Mar. 29, 2002, of U.S. patent application Ser. No. 10/461,613, entitled "SEMICONDUCTOR INTERCONNECTION STRUCTURE WITH TaN AND METHOD OF FORMING THE SAME", filed on Jun. 13, 2003 now U.S. Pat. No. 6,876,078, which claims priority from Korean Patent Application No. 2002-33635, entitled "SEMICONDUCTOR INTERCONNECTION STRUCTURE WITH TaN AND METHOD OF FORMING THE SAME", filed on Jun. 17, 2002, and of U.S. patent application Ser. No. 10/404,360, entitled "METHOD AND APPARATUS FOR FORMING A METAL LAYER ON A SEMICONDUCTOR DEVICE," filed on Apr. 1, 2003, now U.S. Pat. No. 7,067,420 which claims priority from Korean Patent Application No. 2002-28201, entitled "METHOD AND APPARATUS FOR FORMING A METAL LAYER ON A SEMICONDUCTOR DEVICE," filed on May 21, 2002. This application also claims priority from Korean Patent Application No. 2003-33905, filed on May 28, 2003, the contents of which are herein incorporated by reference in their entirety for all purposes.

BACKGROUND OF THE INVENTION

1. Field of the Invention

This disclosure relates to semiconductor devices. More particularly, this disclosure relates to a method for forming a wiring[of a semiconductor device, for example, such as a tantalum nitride wiring, capable of simplifying processes for forming a wiring and preventing failures of semiconductor devices using a novel tantalum precursor, a method for forming a metal layer of a semiconductor device and an apparatus for performing the same.

2. Description of the Related Art

As computers have become widely used, memory devices using semiconductor devices have been remarkably developed. These semiconductor devices must operate at a high speed and simultaneously have a great amount of storage capacity. Technology has been developed to improve the integration degree, reliability, and response speed of a semiconductor device.

Forming a wiring in a semiconductor substrate is required to embody the semiconductor device on the substrate, because the wiring is used to transmit an electric signal. The wiring needs to have a low electric resistance and a high reliability. As the semiconductor device has been highly integrated the diameter of a contact hole has been reduced, and thus, the width and a thickness of the wiring have been also reduced. As a result, it has been more difficult to form a wiring.

According to the above description, a wiring including a metal layer used for a semiconductor devices must be strictly formed. Previously, a metal wiring including aluminum or tungsten is formed of with a multi-layered structure to raise the integration degree of a semiconductor device. However, since aluminum has a specific resistance of about $2.8 \times 10^{-8}$ $\Omega$m and tungsten has a specific resistance of about $5.5 \times 10^{-8}$ $\Omega$m, aluminum and tungsten are inappropriate for the metal wiring of the multi-layered structure. Copper is instead recently used for the multi-layered structure because copper has a relative low specific resistance and an improved electromigration characteristic.

Copper has a greater electromigration characteristic than silicon and silicon oxide. Accordingly, when copper reacts with silicon and silicon oxide, copper is readily oxidized. It has been shown to be preferable to use a metal barrier layer to prevent oxidation of the copper used in the wiring.

A titanium nitride layer has been widely used as the metal barrier layer. A titanium nitride layer of a thickness of above about 30 nm has been used to restrict the electro-migration of copper. However, a titanium nitride layer having a thickness of above about 30 nm has a high resistance because the resistance of the titanium nitride layer is proportional to the thickness of the titanium nitride layer. Additionally, titanium nitride layer has high reactivity. As a result, the titanium nitride layer is not well suited as a metal barrier layer.

A tantalum nitride layer is a better choice for the metal barrier layer of the copper. A thin tantalum nitride layer adequately restricts the electromigration of copper. Furthermore, the tantalum nitride layer has excellent step coverage, gap-filling characteristic, etc. Therefore, a tantalum nitride layer has been used as the metal barrier layer, as well as a metal plug, metal wiring, metal gate, a capacitor electrode, etc.

FIG. 1 is a cross sectional view illustrating a conventional method for forming a wiring of a semiconductor.

Referring to FIG. 1, an insulating layer 12 is formed on a substrate 10. A diffusion preventing layer including titanium nitride, a conductive layer including aluminum, an adhesive layer including titanium and a reflection preventing layer including titanium nitride are subsequently formed on the insulating layer 12. The diffusion preventing layer, the conductive layer, the adhesive layer and the reflection preventing layer are etched by a photolithography process to form patterns including a diffusion preventing layer pattern 13, a conductive layer pattern 15, an adhesive layer pattern 17 and a reflection preventing layer pattern 19. An insulating interlayer 21 is formed on the resultant structure. The insulating interlayer 21 is patterned using a photoresist pattern (not shown) to form a via hole 22 exposing an upper face of the reflection preventing layer pattern 19.

The photoresist pattern is removed by an ashing process. The organic material remaining on the upper face of the reflection preventing layer pattern 19 after the ashing process is removed by a wet cleaning process. Since the photoresist pattern includes a photo acid generator (PAG) that generates an acid through a photosensitive reaction, an acid is generated by the photolithography process. When the wet cleaning process is performed under the condition including the acid, a cleaning solution is mixed with the acid to have a weak acidity. When the substrate is misaligned in the photolithography process, a defect such as a scratch may be formed on the reflection preventing layer 19.

Generally, aluminum used as the conductive layer pattern 15 has a strong crystallization property, and thus aluminum may have an uneven surface. Namely, a groove is formed in an interface between grains of aluminum. When titanium and titanium nitride are deposited on the surface of aluminum, a titanium layer and a titanium nitride layer formed in the groove may be thinner than a titanium layer or titanium nitride layer formed on the surface of aluminum.

When the wet cleaning process is performed, thin weak nitride layer may be attacked by the acid solution and then removed because the titanium nitride has a chemical tolerance relative to the weak acid solution. The titanium layer and the aluminum layer beneath the groove in particular may be attacked by the acid solution, thereby deepening the groove. When photoresist is later coated and patterned, the photoresist may remain in the deep groove. As a result, a ring defect may be generated along the interface between grains of aluminum.

The ring defect induces a short between metal wirings, thereby deteriorating characteristic and reliability of a semiconductor device. Furthermore, since the interval between the metal wirings is reduced due to the high integration of a semiconductor device, the ring effect is a greater problem. To overcome this problem, an oxide layer pattern is formed on a reflection preventing layer including titanium nitride. After a metal wiring is formed using the oxide layer pattern as a hard mask, the oxide layer pattern is removed. However, this solution complicates the formation of the metal wiring, as will be explained further.

In the multi-layered structure, a via plug for connecting between upper and lower wirings is formed in an insulating interlayer. When a via hole filled with the via plug is formed through the insulating interlayer, a reflection preventing layer or a conductive layer pattern beneath the reflection preventing layer is exposed through the via hole.

However, when the conductive layer pattern is exposed through the via hole, the reliability of the lower wiring may be reduced. This is caused by the minute groove formed in the interface between the grains of aluminum used for the conductive layer pattern. The minute groove may be not filled with the via plug so that a void causing an electrical failure of the via plug may be formed. Accordingly, the structure having the reflection preventing layer that is only exposed through the via hole may be widely used.

For example, as shown in FIG. 1, when the via hole 22 is formed through the insulating interlayer 21 to expose the reflection preventing layer 19, a recessed portion may be formed on a surface of the reflection preventing layer 19 because the reflection preventing layer 19 including titanium nitride has a low etching selectivity relative to the insulating interlayer 21 including oxide. The conductive layer 15 including aluminum may be even exposed. The reflection preventing layer 19 may have a sufficient thickness to prevent the exposure of the conductive layer 15. However, when the reflection preventing layer 19 has a sufficient thickness, filling the space between the wirings with the insulating interlayer 21 may be difficult and may create the aforementioned void.

Therefore, a new technology for forming a wiring is required to improve the reliability of a semiconductor device. A tantalum nitride layer has been used as a reflection preventing layer or a barrier layer.

A method for forming a tantalum nitride layer is disclosed in U.S. Pat. No. 6,204,204 (issued to Paranjpe et al.), U.S. Pat. No. 6,153,519 (issued to Jain et al.), U.S. Pat. No. 5,668,054 (issued to Sun et al.), etc. In a method disclosed in the U.S. Pat. No. 5,668,054, a tantalum nitride layer is formed by a chemical vapor deposition (CVD) process using terbutylimido-tris-diethylamino-tantalum $((Net_2)_3Ta\!=\!NtBu)$ as a reactant. The CVD process is performed at a temperature of above about 600° C. When the CVD process is performed at a temperature of about 500° C., the tantalum nitride layer has a specific resistance of above about 10,000 Wcm. Since the process is performed at a high temperature, a thermal attack may be applied to a semiconductor device making the CVD process more difficult.

Recently, an atomic layer deposition (ALD) method has been proposed as an alternating technology for the CVD process. There are merits to the ALD method in that the tantalum nitride layer may be formed at a relative low temperature and may have improved step coverage. Methods for forming tantalum nitride layer by an ALD process are disclosed in U.S. Pat. No. 6,203,613 (issued to Gates et al.) and a document of Kang et al., entitled "Electrochemical and Solid-State Letters". According to Kang et al., a tantalum nitride layer having a specific resistance of about 400 µm may be formed by an ALD process using terbutylimido-tris-diethylamino-tantalum. Accordingly, the tantalum nitride layer having a low specific resistance may be formed at a low temperature.

However, a hydrogen radical created by a plasma-enhanced process is required as a reducing agent in the document. A power source is applied to a chamber to form the hydrogen radical. Thus, the method requires the control of the power source applied directly to the substrate. Since the power source is directly applied to a substrate, the substrate may be damaged.

Accordingly, a new method for forming a tantalum nitride layer is required, which is performed at a low temperature, and has improved step coverage and simple processing requirements.

A method for fabricating $Ta(NC(Ch_3)_2C_2H_5)(N(CH_3)_2)_3)$ and a metal organic chemical vapor deposition (MOCVD) method using a precursor solution including the same are disclosed in Japanese Patent Laid Open Publication No. 2002-193981. According to the method, 1 mole of $TaCl_5$, 4 moles of $LiNMe_2$ and 1 mole of LiNHtAm are reacted with each other in an organic solution at a room temperature to form a compound, which is then filtered. The organic solution is removed from the filtered compound to form $Ta(NC(Ch_3)_2C_2H_5)(N(CH_3)_2)_3)[.\quad Ta(NC(Ch_3)_2C_2H_5)(N(CH_3)_2)_3)$ is ], which is then dissolved in an organic solution. Dissolved $Ta(NC(Ch_3)_2C_2H_5)(N(CH_3)_2)_3)$ is deposited on a substrate loaded in a CVD chamber to form a tantalum nitride layer.

$Ta(NC(Ch_3)_2C_2H_5)(N(CH_3)_2)_3)$ may be readily fabricated according to the method, but the Japanese Patent Laid Open Publication describes that the tantalum nitride layer is formed using only $Ta(NC(Ch_3)_2C_2H_5)(N(CH_3)_2)_3)$. It may not be desirable to use only $Ta(NC(Ch_3)_2C_2H_5)(N(CH_3)_2)_3)$ to form the tantalum nitride layer. Particularly, when the MOCVD process is performed on the substrate using only $Ta(NC(Ch_3)_2C_2H_5)(N(CH_3)_2)_3)$, the pressure in the chamber is not sufficiently high and the MOCVD process may be ineffective.

SUMMARY OF THE INVENTION

Embodiments of the present invention provide a method for forming a wiring of a semiconductor device, which is capable of performing a deposition process at a low temperature, readily embodying improved step coverage and having a simple processing parameter using a precursor that includes a tantalum amine derivative.

Embodiments of the present invention also provide a method for forming a wiring of a semiconductor device by a chemical vapor deposition process that uses a precursor including a tantalum amine derivative.

Embodiments of the present invention further provide a method for forming a metal layer of a semiconductor device using a precursor that includes a tantalum amine derivative.

Embodiments of the present invention still further provide an apparatus for forming a metal layer of a semiconductor device using a precursor that includes a tantalum amine derivative.

In accordance with one aspect of the present invention, a method is provided for forming a wiring of a semiconductor device using an atomic layer deposition. In this method, after an insulating interlayer is formed on a substrate, tantalum amine derivatives comprising $Ta(NR_1)(NR_2R_3)_3$ (wherein $R_1$, $R_2$ and $R_3$ are H or $C_1$–$C_6$ alkyl group) are introduce onto the insulating interlayer. A portion of the tantalum amine derivatives is chemisorbed onto the insulating interlayer. Non-chemisorbed tantalum amine derivatives on the insulating interlayer are removed from the insulating interlayer. A reacting gas is introduced onto the insulating interlayer. A ligand in the tantalum amine derivatives chemisorbed on the insulating interlayer is removed from the tantalum amine derivatives by a chemical reaction between the reacting gas and the ligand, which form a solid material including tantalum nitride. Then, the solid material is accumulated on the insulating interlayer through repeating above-described steps to thereby form a wiring.

In accordance with another aspect of the present invention, a method is provided for forming a wiring of a semiconductor device using an atomic layer deposition. In this method, after a conductive layer is formed on a substrate, tantalum amine derivatives comprising $Ta(NR_1)(NR_2R_3)_3$ (in which $R_1$, $R_2$ and $R_3$ are H or $C_1$–$C_6$ alkyl group) are introduced onto the conductive layer. A portion of the tantalum amine derivatives is chemisorbed on the conductive layer. The rest of tantalum amine derivatives non-chemisorbed on the conductive layer are removed from the conductive layer. A reacting gas is introduced over the substrate. A ligand in the tantalum amine derivatives chemisorbed on the conductive layer is removed from the tantalum amine derivatives by a chemical reaction between the reacting gas and the ligand, which form a solid material including tantalum nitride. Then, the solid material is accumulated on the conductive layer through repeating above-described steps to thereby form a wiring.

In accordance with still another aspect of the present invention, a method is provided for forming a wiring of a semiconductor device using an atomic layer deposition. In this method, after insulating layer is formed on a substrate, and tantalum amine derivatives comprising $Ta(NR_1)(NR_2R_3)_3$ (in which $R_1$, $R_2$ and $R_3$ are H or $C_1$–$C_6$ alkyl group an a reacting gas selected from the group consisting of $H_2$, $NH_3$, $SiH_4$, and $Si_2H_6$ are introduced onto the insulating layer. Then, the tantalum amine derivatives and the reacting gas are deposited on the insulating layer to form a wiring including tantalum nitride.

In accordance with still another aspect of the present invention, a method is provided for forming a wiring of a semiconductor device using an atomic layer deposition. In this method, after a conductive layer is formed on a substrate, tantalum amine derivatives comprising $Ta(NR_1)(NR_2R_3)_3$ (in which $R_1$, $R_2$ and $R_3$ are H or $C_1$–$C_6$ alkyl group) a reacting gas selected from the group consisting of $H_2$, $NH_3$, $SiH_4$, and $Si_2H_6$ are introduced onto the conductive layer. Then, the tantalum amine derivatives and the reacting gas are deposited on the conductive layer to form a wiring including tantalum nitride.

In accordance with still another aspect of the present invention, a method is provided for forming a metal layer of a semiconductor device. In this method, after a substrate is cleaned using a plasma, tantalum amine derivatives comprising $Ta(NR_1)(NR_2R_3)_3$ (in which $R_1$, $R_2$ and $R_3$ are H or $C_1$–$C_6$ alkyl group) and a reacting gas selected from the group consisting of $H_2$, $NH_3$, $SiH_4$, and $Si_2H_6$ are introduced onto the substrate. The tantalum amine derivatives and the reacting gas are deposited on the substrate to form a first metal layer including tantalum nitride. The first metal layer is treated using a plasma. A second metal layer including copper is formed on the first metal layer.

In accordance with still another aspect of the present invention, a method is provided for forming a wiring of a semiconductor device. In this method, an insulating layer having a contact hole and a trench is formed on a substrate. Tantalum amine derivatives comprising $Ta(NR_1)(NR_2R_3)_3$ (in which $R_1$, $R_2$ and $R_3$ are H or $C_1$–$C_6$ alkyl group) and a reacting gas selected from the group consisting of $H_2$, $NH_3$, $SiH_4$, and $Si_2H_6$ are introduced onto the insulating layer. The tantalum amine derivatives and the reacting gas are deposited in the contact hole and the trench to form a barrier layer including tantalum nitride. The contact hole and the trench are filled with a metal layer.

In accordance with still another aspect of the present invention, an apparatus is provided for forming a metal layer of a semiconductor device. The apparatus includes a loadlock chamber for loading/unloading a substrate. A transfer chamber for transferring the substrate is connected to the loadlock chamber. A clean chamber for cleaning the substrate using a plasma receives the substrate from the transfer chamber. A first process chamber for forming a first metal barrier layer on the substrate by a sputtering process receives the substrate from the transfer chamber. Tantalum amine derivatives comprising $Ta(NR_1)(NR_2R_3)_3$ (in which $R_1$, $R_2$ and $R_3$ are H or $C_1$–$C_6$ alkyl group) and a reacting gas selected from the group consisting of $H_2$, $NH_3$, $SiH_4$, and $Si_2H_6$ are introduced into a second process chamber. The tantalum amine derivatives and the reacting gas are deposited on the substrate in the second process chamber to form a second metal barrier layer. The first or the second metal barrier layer is treated in a treatment chamber. A first copper layer is formed on the first or the second metal barrier layer in a third process chamber by a sputtering process. A second copper layer is formed on the first or the second metal barrier layer in a fourth process chamber by a chemical vapor deposition process or an atomic layer deposition process. A controller controls the transfer of the substrate to selectively transfer the substrate to the chambers.

According to embodiments of the present invention, the metal wiring is formed using tantalum nitride as the precursor so that the metal wiring may have a rapid deposition speed and improved step coverage without defects. The metal wiring may be used as a metal barrier layer, a metal plug and so on.

BRIEF DESCRIPTION OF THE DRAWINGS

The above and other features and advantages of the invention will become readily apparent by reference to the following detailed description when considered in conjunction with the accompanying drawings wherein.

DESCRIPTION OF THE PREFERRED EMBODIMENTS

Figure 1:
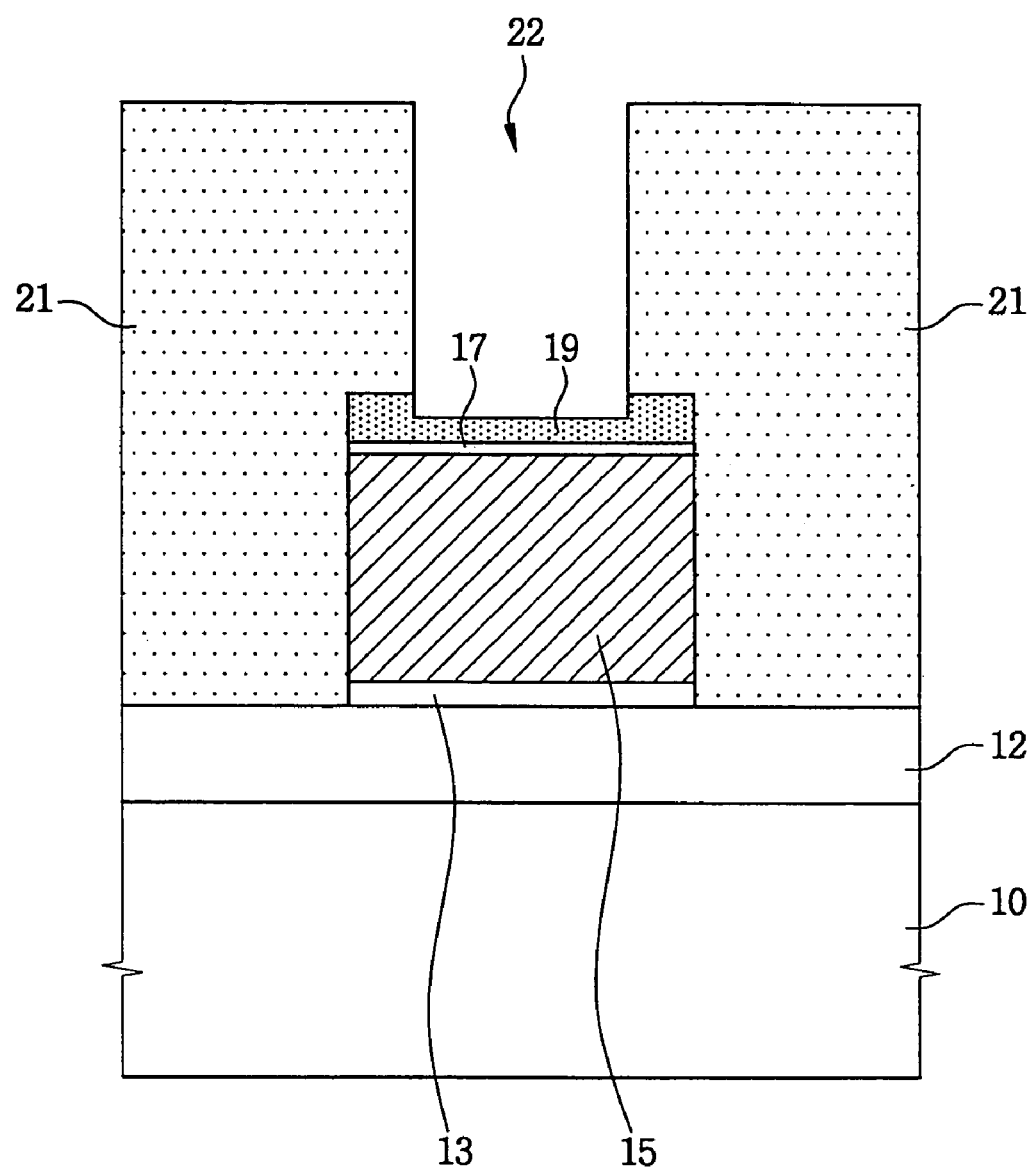
FIG. 1 is cross sectional view illustrating a conventional method for forming a wiring of a semiconductor device.

The present invention now will be described more fully hereinafter with reference to the accompanying drawings, in which exemplary embodiments of the present invention are shown. The invention may, however, be embodied in many different forms and should not be construed as limited to the embodiments set forth herein; rather, these embodiments are provided so that this disclosure will be thorough and complete, and will fully convey the scope of the present invention to those skilled in the art. In the drawings, the thickness of layers and regions are exaggerated for clarity. Like numbers refer to similar or identical elements throughout. It will be understood that when an element such as a layer, region or substrate is referred to as being "on" or "onto" another element, it can be directly on the other element or intervening elements may also be present.

Hereinafter, a method for forming a wiring according to the present invention will be illustrated in detail.

In a method according to one embodiment of the present invention, an insulating interlayer is formed on a silicon substrate. The substrate is disposed in a chamber. Tantalum amine derivatives represented by a chemical formula $Ta(NR_1)(NR_2R_3)_3$ (in which $R_1$, $R_2$ and $R_3$ represent H or $C_1$–$C_6$ alkyl group) are introduced onto the insulating interlayer. A portion of the tantalum amine derivatives is chemisorbed on the insulating interlayer. The rest of tantalum amine derivatives non-chemisorbed on the insulating interlayer are removed from the insulating interlayer. A reacting gas is introduced onto the insulating interlayer. A ligand in the tantalum amine derivatives chemisorbed on the insulating interlayer is removed from the tantalum amine derivatives by a chemical reaction between the reacting gas and the ligand to form a solid material including tantalum nitride, which is accumulated on the insulating interlayer through repeating the above steps to form a wiring.

Alternatively, the ligand may be removed through ligand exchange. A reacting force between the reacting gas and the ligand is stronger than a bonding strength of the ligand so that the ligand may be removed. Here, since a Ta≡N bond is a double bond, the Ta≡N bond is only slightly influenced by the reacting gas. As a result, an atomic thin layer including the Ta≡N bond is formed on the substrate.

On the other hand, in forming the atomic layer, a reaction mechanism using a reducer is disclosed in the document written by Kang et al. However, hydrogen radical as the reducer may be substituted for a ligand in accordance with contents of the document.

A thin film having a low specific resistance is formed at a low temperature using the method of the present invention. In particular, since the reacting gas activated by a remote plasma is used in the method of the present invention, processing requirements of using a plasma may be excluded.

The ALD method is repeatedly performed to form a tantalum nitride layer. When the tantalum nitride layer is formed on a pattern that includes an opening having an aspect ratio, the tantalum nitride layer has improved step coverage and a uniform thickness. The ALD method may include a thermal ALD and a radical assisted ALD (RAALD) using a remote plasma. The tantalum amine derivatives may include $Ta(NC(CH_3)_2C_2H_5)(N(CH_3)_2)_3)$.

$Ta(NC(CH_3)_2C_2H_5)(N(CH_3)_2)_3)$ has a vapor pressure higher than $((Net_2)_3Ta=NtBu)$ at a same temperature. $Ta(NC(CH_3)_2C_2H_5)(N(CH_3)_2)_3)$ and $((Net_2)_3Ta=NtBu)$ do not include a halogen element such as chlorine, fluorine, bromine and so on. $((Net_2)_3Ta=NtBu)$ has a vapor pressure of about 0.01 Torr at a temperature of about 60° C. and is in a liquid state at a room temperature. $Ta(NC(CH_3)_2C_2H_5)(N(CH_3)_2)_3)$ has a vapor pressure of about 0.1 Torr at a temperature of about 60° C. and is in a solid state at a room temperature. $Ta(NC(CH_3)_2C_2H_5)(N(CH_3)_2)_3)$ has a melting point of about 34° C., thus $Ta(NC(CH_3)_2C_2H_5)(N(CH_3)_2)_3)$ is changed into a liquid state by heating at a temperature of about 40° C. Accordingly, very small amount of particles may be generated through the heating of $Ta(NC(CH_3)_2C_2H_5)(N(CH_3)_2)_3)$. As a result, although $((Net_2)_3Ta=NtBu)$ may be an excellent tantalum nitride precursor, it is preferable that $Ta(NC(CH_3)_2C_2H_5)(N(CH_3)_2)_3)$ be used as the tantalum nitride precursor.

An inert gas including argon (Ar), helium (He) and nitrogen ($N_2$) is purged into the chamber to remove the non-chemisorbed reacting gas. The reacting gas may include $H_2$, $NH_3$, $SiH_4$ or $Si_2H_6$. The reacting gas may be preferably activated using the remote plasma. The ALD process may be carried out under pressure of about 0.01 Torr to about 30 Torr. Preferably, the ALD process may be carried out under pressure of about 0.01 Torr to about 10 Torr. More preferably, the ALD process may be carried out under pressure of about 0.01 Torr to about 5 Torr. Additionally, the ALD process may be performed at a temperature of about 100° C. to about 450° C. Preferably, the ALD process may be performed at a temperature of about 100° C. to about 350° C.

The wiring may be employed in the following applications.

In one application, a contact hole is formed through the insulating interlayer to expose the substrate. The solid material may include a wiring that fills the contact hole. A novel metal layer including titanium, tantalum or novel metal may be further formed on insulating interlayer.

In another application, a contact hole is formed through the insulating interlayer to expose the substrate. The solid material may include a plug filling the contact hole. A novel metal layer including titanium, tantalum or novel metal may be further formed on insulating interlayer. A second wiring may be formed on the wiring. The second wiring may include a titanium layer, a tantalum layer, an aluminum layer, a copper layer, a tungsten layer, a novel metal layer or a metal nitride layer. The novel metal layer may include ruthenium (Ru), platinum (Pt) or iridium (Ir). The metal nitride layer may include titanium nitride, tantalum nitride or tungsten nitride. Performing the ALD process may be repeated at least once on the second wiring to form a layer including tantalum nitride.

In still another application, a contact hole is formed through the insulating interlayer to expose the substrate. The solid material may include a metal barrier layer formed on a surface of the substrate, and a side wall and a bottom face of the contact hole. Regardless which of the contact hole has an aspect ratio of above about 10:1, the metal barrier layer may have improved step coverage. A conductive layer including a titanium layer, a tantalum layer, an aluminum layer, a copper layer, a tungsten layer, a novel metal layer or a metal nitride layer may be further formed on the metal barrier layer. An adhesive layer may be formed on the conductive layer. The adhesive layer may include titanium or tantalum.

The method of the present invention may be employed in a damascene process that has recently been widely used.

In accordance with a single damascene process, a first insulating interlayer is formed on a substrate or a lower wiring. A contact hole exposing the substrate or a via hole exposing the lower wiring is formed through the first insulating interlayer. Tantalum nitride is deposited on a side wall and a bottom face of the contact hole or the via hole using the method of the present invention to form a first diffusion preventing layer. A first metal layer including copper is formed on the first diffusion preventing layer. The first metal layer is planarized by a CMP process for exposing the first insulating interlayer to form a contact plug or a via plug surrounded by the diffusion preventing layer. A second insulating interlayer is formed on the first insulating interlayer. The second insulating interlayer is etched to form a trench exposing the contact hole or the via hole. Tantalum nitride is deposited on a side wall and a bottom face of the trench using the method of the present invention to form a second diffusion preventing layer. A second metal layer including copper is formed on the second diffusion preventing layer. The second metal layer is planarized for exposing the second insulating interlayer by a CMP process to form a copper wiring.

In accordance with a dual damascene process, an insulating layer having a trench is formed on a substrate or a lower wiring. For example, a preliminary via hole is formed through the insulating layer by a typical lithography process. The trench passing over the preliminary via hole is formed through the insulating layer by a lithography process. Alternatively, a second insulating layer may be formed on the insulating layer. The second insulating layer may be patterned to form the trench. A via hole or a contact hole having sizes smaller than the trench may be formed through the second insulating layer by a typical lithography process. Tantalum nitride is deposited on the second insulating layer using the method of the present invention to form a diffusion preventing layer. The contact/via hole and the trench are filled with a metal layer including copper. The metal layer is planarized for exposing the second insulating layer by a CMP process to form a wiring.

In a method according to another embodiment of the present invention, an insulating layer is formed on a substrate. Tantalum amine derivatives comprising $Ta(NC(Ch_3)_2C_2H_5)(N(CH_3)_2)_3)$ in which $R_1$, $R_2$ and $R_3$ are H or $C_1$–$C_6$ alkyl group and a reacting gas selected from the group consisting of $H_2$, $NH_3$, $SiH_4$, and $Si_2H_6$ are introduced onto the insulating layer. The tantalum amine derivatives and the reacting gas are deposited on the insulating layer to form a wiring including tantalum nitride.

Examples of the tantalum amine derivatives may include $Ta(NC(CH_3)_2C_2H_5)(N(CH_3)_2)_3)$. The deposition process may include a CVD process. Preferably, the deposition process may include a thermal CVD process or a plasma enhanced CVD (PECVD) process.

The deposition process may be performed at a temperature of about 100° C. to about 450° C. Preferably, the deposition process may be performed at a temperature of about 100° C. to about 350° C. The deposition process may be carried out under pressure of about 0.05 Torr to about 30 Torr. Preferably, the deposition process may be carried out under pressure of about 0.3 Torr to about 10 Torr. More preferably, the deposition process may be carried out under pressure of about 0.3 Torr to about 5 Torr. An inert gas including Ar, He and $N_2$ may be introduced onto the substrate with the reacting gas. Additionally, an adhesive layer may be formed on the wiring. The adhesive layer may include titanium or tantalum.

The method of another embodiment may be performed on the insulating layer through which an opening having an aspect ratio is formed. No matter which the contact hole has a high aspect ratio of, for example, above about 10:1, the wiring having a uniform thickness may have improved step coverage.

In a method using an ALD process according to still another embodiment of the present invention, a conductive layer is formed on a substrate loaded in a chamber. Tantalum amine derivatives comprising $Ta(NR_1)(NR_2R_3)_3$ in which $R_1$, $R_2$ and $R_3$ are H or $C_1$–$C_6$ alkl group are introduced onto the conductive layer. A portion of the tantalum amine derivatives is chemisorbed on the conductive layer. The rest of tantalum amine derivatives non-chemisorbed on the conductive layer [is]are removed from the conductive layer. A reacting gas is introduced over the substrate. A ligand in the tantalum amine derivatives chemisorbed on the conductive layer is removed from the tantalum amine derivatives by a chemical reaction between the reacting gas and the ligand to form a solid material including tantalum nitride. The solid material is accumulated through repeating the above steps to form a wiring on the conductive layer.

Examples of the tantalum amine derivatives may include $Ta(NC(CH_3)_2C_2H_5)(N(CH_3)_2)_3)$. The ALD process may include a thermal ALD process or a radical assisted ALD process using a remote plasma.

An inert gas including Ar, He and $N_2$ is purged into the chamber to remove the non-chemisorbed reacting gas. Examples of the reacting gas may include $H_2$, $NH_3$, $SiH_4$ or $Si_2H_6$. Additionally, an adhesive layer may be formed on the conductive layer. The adhesive layer may include titanium or tantalum. The conductive layer may include aluminum or tungsten. The wiring may include a reflection preventing layer (or anti-reflective layer).

An insulating layer may be further formed on the wiring. The insulating layer may be etched to form a via hole exposing the wiring. Additionally, the wiring may be etched to form a mask. The conductive layer may be etched using the mask.

In a method according to still another embodiment of the present invention, a conductive layer is formed on a substrate. Tantalum amine derivatives comprising $Ta(NR_1)(NR_2R_3)_3$ in which $R_1$, $R_2$ and $R_3$ are H or $C_1$–$C_6$ alkyl group and a reacting from the group consisting of $H_2$, $NH_3$, $SiH_4$, and $Si_2H_6$ are introduced onto the conductive layer. The tantalum amine derivatives and the reacting gas are deposited on the conductive layer to form a wiring including tantalum nitride. The tantalum amine derivatives may include Ta(NC(Ch$_3$)$_2$C$_2$H$_5$)(N(CH$_3$)$_2$)$_3$). The deposition process may include a CVD process. Preferably, the deposition process may include a thermal CVD and a plasma enhanced CVD.

Additionally, an adhesive layer may be formed on the conductive layer. The adhesive layer may include titanium or tantalum. The conductive layer may include aluminum or tungsten. The wiring may include a reflection preventing layer.

An insulating layer may be further formed on the wiring. The insulating layer may be etched to form a via hole exposing the wiring. Additionally, the wiring may be etched to form a mask. The conductive layer may be etched using the mask.

Figure 2A:
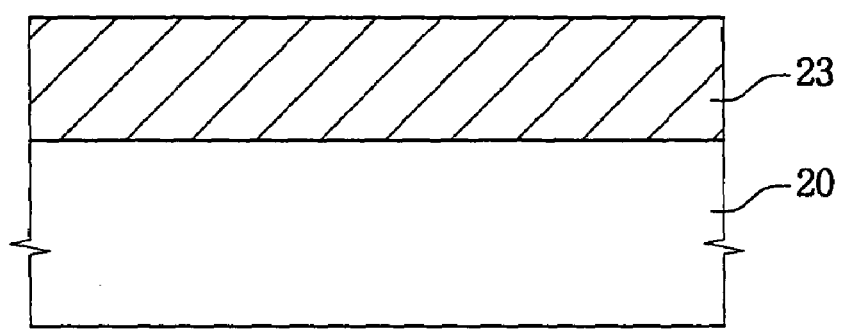
FIGS. 2A to 2C are cross sectional views illustrating a method for forming a wiring including tantalum nitride according to a feature of the present invention.
Figure 2B:
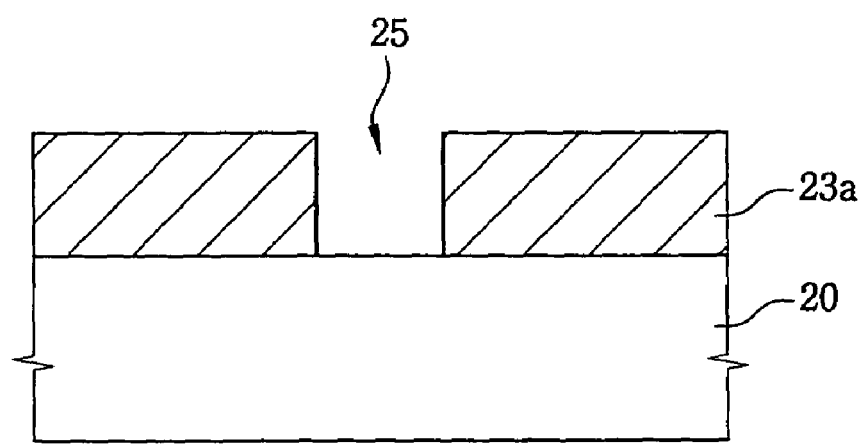
Figure 2C:
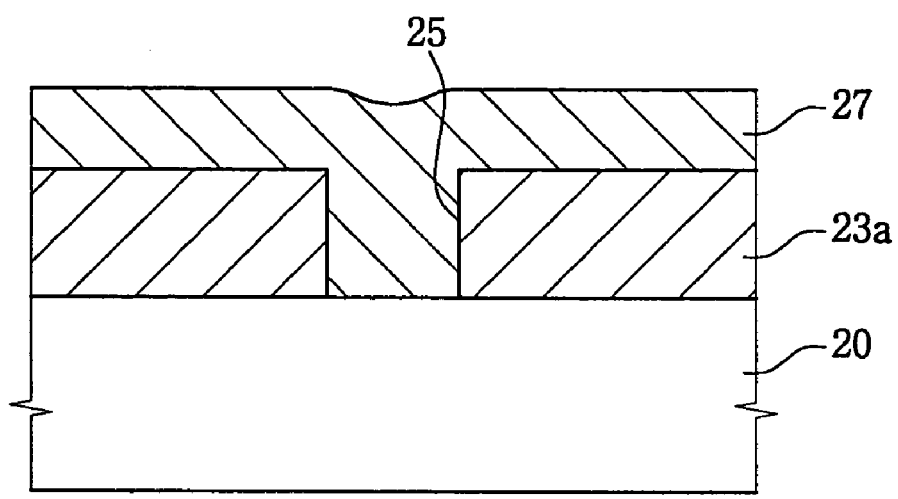

FIGS. 2A to 2C are cross sectional views illustrating a method for forming a wiring including tantalum nitride.

Referring to FIG. 2A, an insulating layer 23 is formed on a silicon substrate 20. The insulating layer 23 may include oxide.

Referring to FIG. 2B, the insulating layer 23 is etched by a photolithography process to form an insulating layer pattern 23a having a contact hole 25.

Referring to FIG. 2C, a wiring 27 is formed on the insulating layer pattern 23a to fill the contact hole 25. In particular, a tantalum precursor is deposited on the insulating layer pattern 23a and in the contact hole 25 to form the wiring 27.

Tantalum amine derivatives comprising Ta(NR$_1$)(NR$_2$R$_3$)$_3$ in which R$_1$, R$_2$ and R$_3$ are H or C$_1$–C$_6$ alkyl group as the tantalum precursor are introduced over the substrate 20. The tantalum amine derivatives may include Ta(NC(CH$_3$)$_2$C$_2$H$_5$)(N(CH$_3$)$_2$)$_3$). Preferably, the tantalum precursor may be introduced in a gaseous state using a bubbler or a liquid delivery system.

The deposition process may include a CVD process, a PECVD process, an ALD process or a RAALD process. A reacting gas including H$_2$, NH$_3$, SiH$_4$ or Si$_2$H$_6$ or a mixture thereof may be further introduced onto the substrate 20.

The wiring 27 may be [post]treated using a radio frequency (RF) plasma to remove impurities remaining in the wiring 27. The RF plasma may be generated through a remote plasma method or a direct plasma method that activates H$_2$, NH$_3$, SiH$_4$ or Si$_2$H$_6$ or a mixture thereof. In the remote plasma method, the RF plasma is generated outside the chamber and then it is introduced into the chamber. In the direct plasma method, the RF plasma is generated inside the chamber.

EMBODIMENT 1

FIGS. 3A to 3F are cross sectional views illustrating a method for forming a wiring according to a first embodiment of the present invention.

Figure 3A:
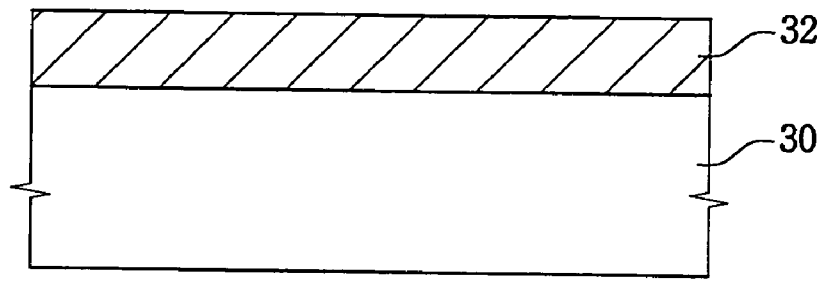
FIGS. 3A to 3F are cross sectional views illustrating a method for forming a wiring according to a first embodiment of the present invention.

Referring to FIG. 3A, a first wiring 32 is formed on a substrate 30. The first wiring 32 may include polysilicon, titanium, tantalum, aluminum, copper, tungsten, novel metal, metal nitride or a mixture thereof. Examples of the novel metal may include Ru, Pt or Ir. Examples of the metal nitride may include titanium nitride, tantalum nitride or tungsten nitride. Additionally, the substrate 30 may be cleaned using a plasma before the formation of the first wiring 32.

Figure 3B:
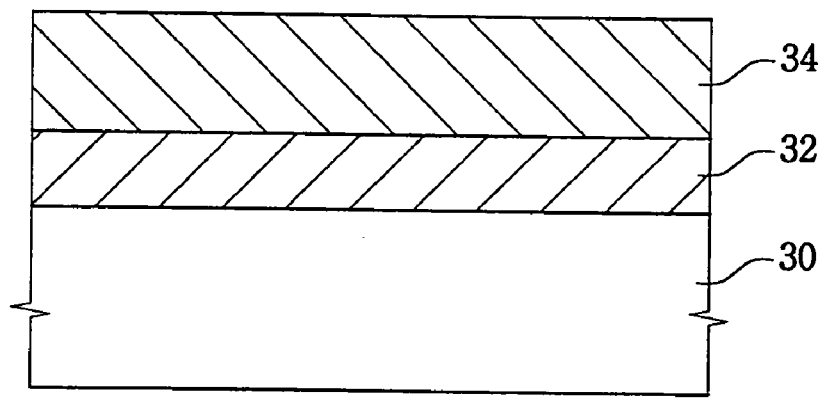

Referring to FIG. 3B, an insulating layer 34 is formed on the first wiring 32. The insulating layer 34 may include oxide.

Figure 3C:
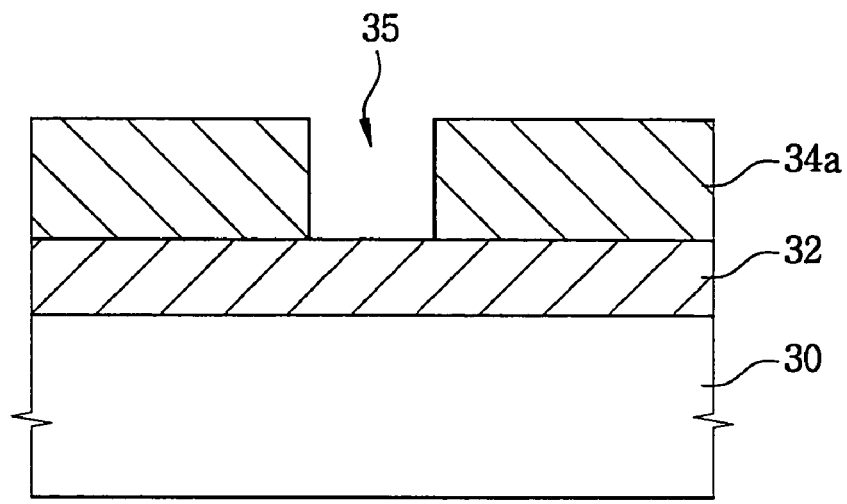

Referring to FIG. 3C, the insulating layer 34 is etched by a typical photolithography process to form an insulating layer pattern 34a having a contact hole 35.

Figure 3D:
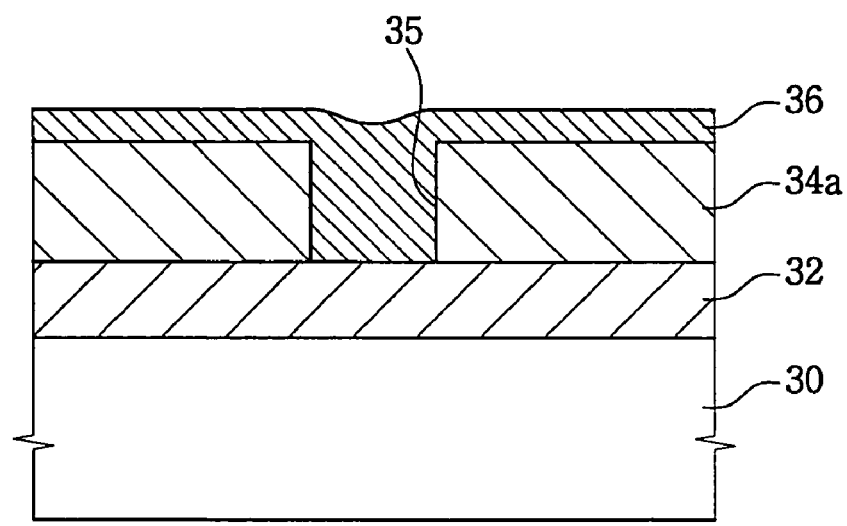

Referring to FIG. 3D, a second wiring 36 is formed by an ALD process or a CVD process on the insulating layer pattern 34a, and a side wall and a bottom face of the contact hole 35. The contact hole 35 may be cleaned using a plasma before the formation of the second wiring 36.

In particular, a source gas including Ta(NC(Ch$_3$)$_2$C$_2$H$_5$)(N(CH$_3$)$_2$)$_3$) and a reacting gas including NH$_3$ are simultaneously introduced over the substrate 30 at a temperature of about 300° C. The NH$_3$ gas is introduced at a flow rate of about 600 sccm. A gas mixed of H$_2$ having a flow rate of about 1,000 sccm and Ar having a flow rate of about 500 sccm is used as a purge gas. An Ar gas having a flow rate of about 100 sccm is used as a carrier gas of Ta(NC(Ch$_3$)$_2$C$_2$H$_5$)(N(CH$_3$)$_2$)$_3$). The second wiring 36 may be treated using a radio frequency (RF) plasma to remove impurities remaining in the second wiring 36. The RF plasma may be generated through a remote plasma method or a direct plasma method that activates H$_2$, NH$_3$, SiH$_4$ or Si$_2$H$_6$ or a mixture thereof. As a result, the second wiring 36 includes tantalum nitride.

Figure 3E:
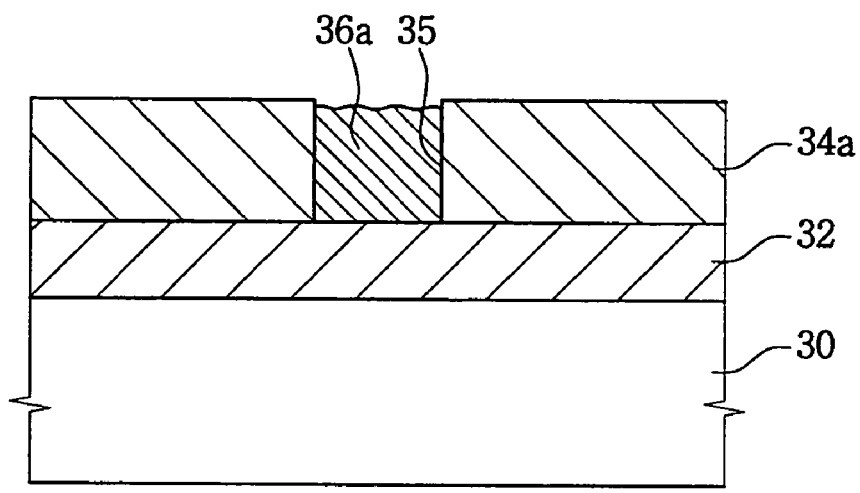

Referring to FIG. 3E, the second wiring 36 is removed by an etching process or a CMP process to expose an upper face of the insulating layer pattern 34a. Accordingly, the second wiring 36 on the insulating layer pattern 34a is removed, thereby forming a contact plug 36a filling the contact hole 35. The contact plug 36a may be cleaned using a plasma.

Figure 3F:
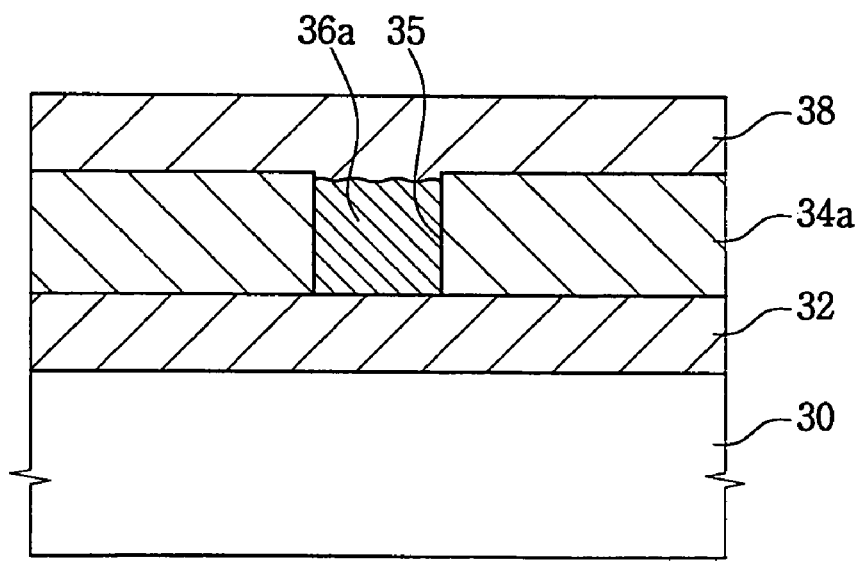

Referring to FIG. 3F, a third wiring 38 is formed on the insulating layer pattern 34a and the contact plug 36a. The third wiring 38 may include polysilicon, titanium, tantalum, aluminum, copper, tungsten, novel metal, metal nitride or a mixture thereof. Examples of the novel metal may include Ru, Pt or Ir. Examples of the metal nitride may include titanium nitride, tantalum nitride or tungsten nitride.

EMBODIMENT 2

Figure 4A:
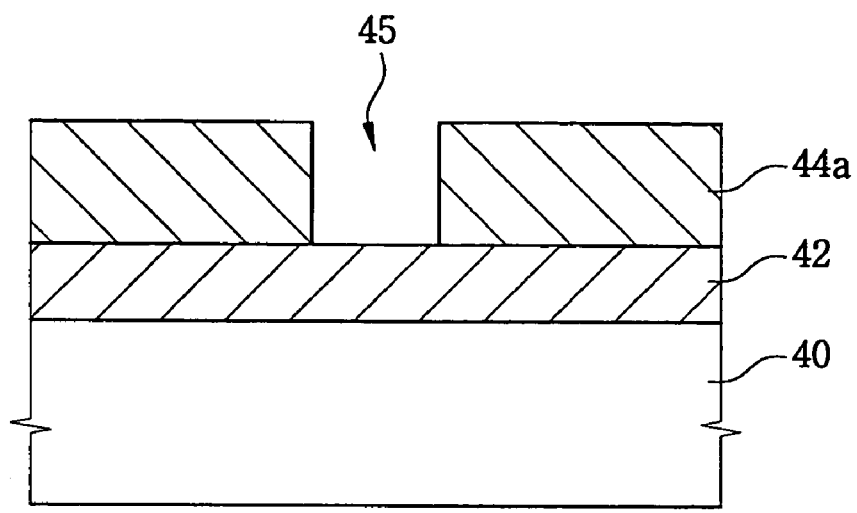
FIGS. 4A and 4B are cross sectional views illustrating a method for forming a wiring according to a second embodiment of the present invention.
Figure 4B:
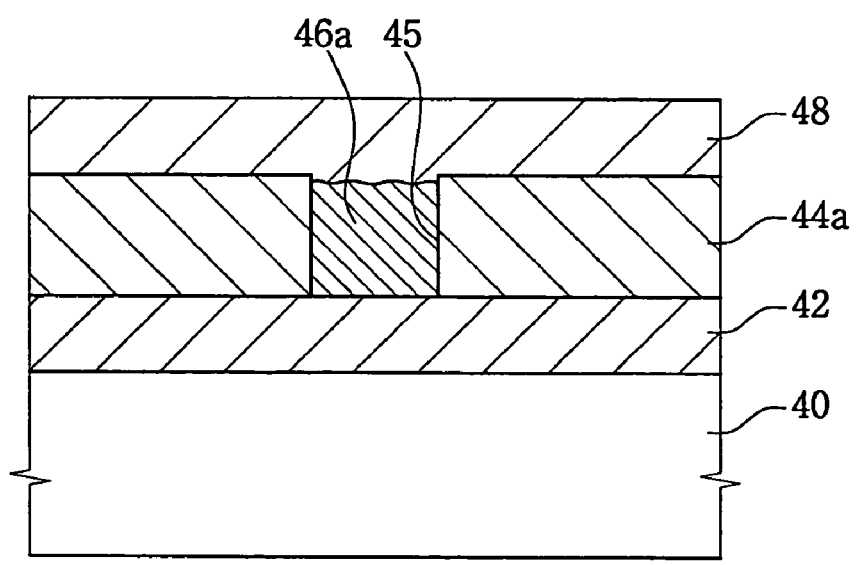

FIGS. 4A and 4B are cross sectional views illustrating a method for forming a wiring according to a second embodiment of the present invention.

Referring to FIG. 4A, a first wiring 42 is formed on a substrate 40. An insulating layer is formed on the first wiring 42. The insulating layer is etched to form an insulating layer pattern 44a having a contact hole 45.

Referring to FIG. 4B, a second wiring is formed on the insulating layer pattern 44a, and a side wall and a bottom face of the contact hole 45. The second wiring may include polysilicon, titanium, tantalum, aluminum, copper, tungsten, novel metal, metal nitride or a mixture thereof. Examples of the novel metal may include Ru, Pt or Ir. Examples of the metal nitride may include titanium nitride, tantalum nitride or tungsten nitride. The substrate 40 may be cleaned using a plasma before the formation of the second wiring.

The second wiring is removed by an etching process or a CMP process to expose an upper face of the insulating layer pattern 44a. Accordingly, the second wiring on the insulating layer pattern 44a is removed, thereby forming a contact plug 46a filling the contact hole 45.

A third wiring 48 is formed on the insulating layer pattern 44a and the contact plug 46a. In particular, a source gas including Ta(NC(Ch$_3$)$_2$C$_2$H$_5$)(N(CH$_3$)$_2$)$_3$) and a reacting gas including NH$_3$ are simultaneously introduced over the substrate 30 at a temperature of about 300° C. The NH$_3$ gas is introduced at a flow rate of 600 sccm. A gas mixed of H$_2$ having a flow rate of about 1,000 sccm and Ar having a flow rate of about 500 sccm is used as a purge gas. An Ar gas having a flow rate of about 100 sccm is used as a carrier gas of $Ta(NC(Ch_3)_2C_2H_5)(N(CH_3)_2)_3)$. As a result, the third wiring 48 includes tantalum nitride.

The third wiring 48 may be cleaned using a plasma. The third wiring 48 may be treated using an RF plasma to remove impurities remaining in the second wiring 36. The RF plasma may be generated through a remote plasma method or a direct plasma method that activates $H_2$, $NH_3$, $SiH_4$ or $Si_2H_6$ or a mixture thereof.

EMBODIMENT 3

Figure 5A:
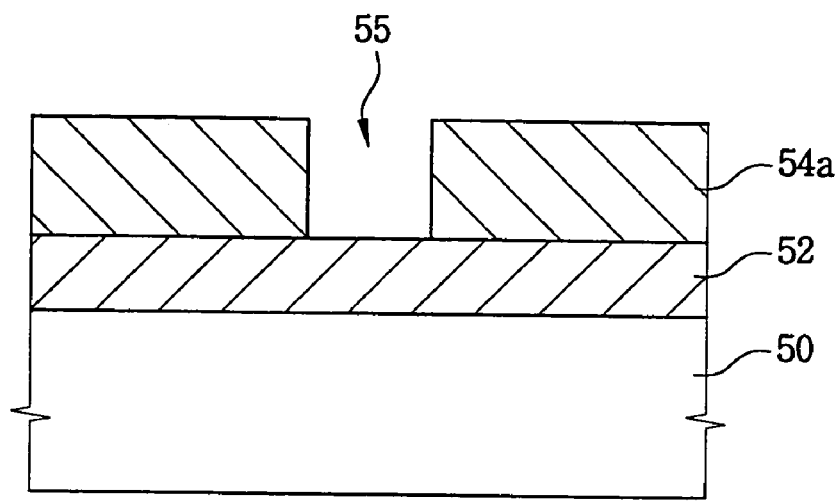
FIGS. 5A to 5C are cross sectional views illustrating a method for forming a wiring according to a third embodiment of the present invention.
Figure 5B:
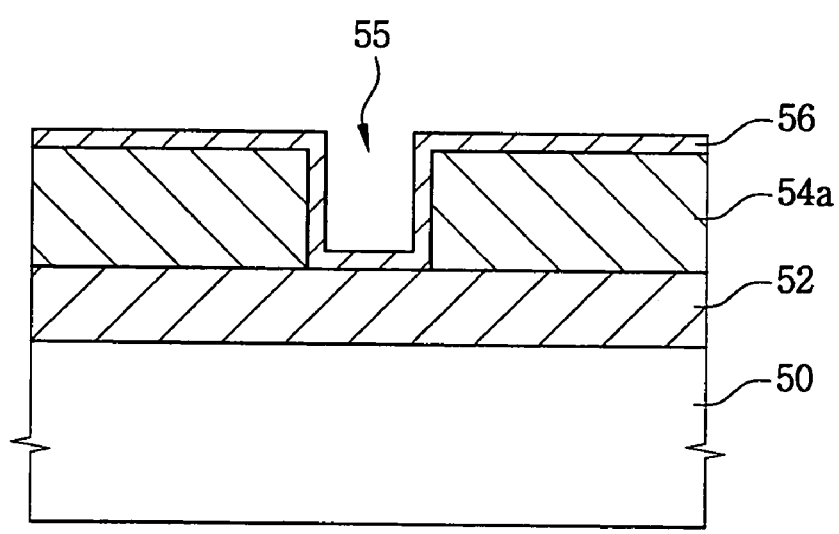
Figure 5C:
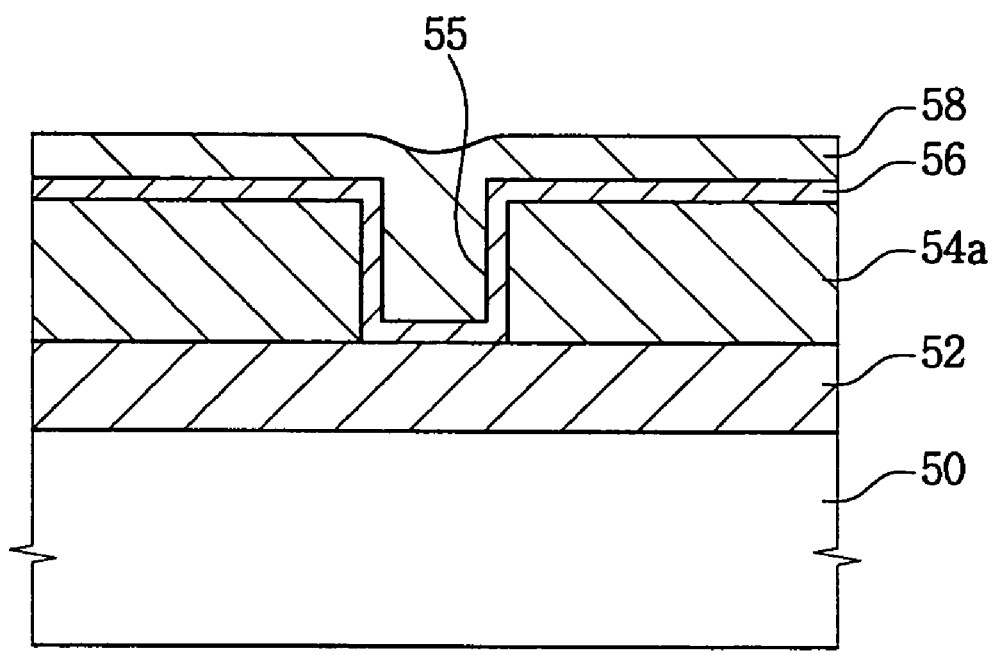

FIGS. 5A to 5C are cross sectional views illustrating a method for forming a wiring according to a third embodiment of the present invention.

Referring to FIG. 5A, a first wiring 52 is formed on a substrate 50. An insulating layer is formed on the first wiring 52. The insulating layer is etched to form an insulating layer pattern 54a having a contact hole 55.

Referring to FIG. 5B, a metal barrier layer 56 is formed on the insulating layer pattern 44a, and a side wall and a bottom face of the contact hole 45. In particular, a source gas including $Ta(NC(Ch_3)_2C_2H_5)(N(CH_3)_2)_3)$ and a reacting gas including $NH_3$ are simultaneously introduced over the substrate 30 at a temperature of about 300° C. The $NH_3$ gas is introduced at a flow rate of 600 sccm. A gas mixed of $H_2$ having a flow rate of about 1,000 sccm and Ar having a flow rate of about 500 sccm is used as a purge gas. An Ar gas having a flow rate of about 100 sccm is used as a carrier gas of $Ta(NC(Ch_3)_2C_2H_5)(N(CH_3)_2)_3)$. As a result, the metal barrier layer 56 includes tantalum nitride.

The substrate 50 may be cleaned using a plasma before the formation of the metal barrier layer 56. The metal barrier layer 56 may be treated using a RF plasma to remove impurities remaining in the metal barrier layer 56. The RF plasma may be generated through a remote plasma method or a direct plasma method that activates $H_2$, $NH_3$, $SiH_4$ or $Si_2H_6$ or a mixture thereof.

Referring to FIG. 5C, a second wiring 58 is formed on the metal barrier layer 56. The second wiring 58 may include polysilicon, titanium, tantalum, aluminum, copper, tungsten, novel metal, metal nitride or a mixture thereof. Examples of the novel metal may include Ru, Pt or Ir. Examples of the metal nitride may include titanium nitride, tantalum nitride or tungsten nitride. The second wiring 58 may be treated using an RF plasma to remove impurities remaining in the second wiring 58. The RF plasma may be generated through a remote plasma method or a direct plasma method that activates $H_2$, $NH_3$, $SiH_4$ or $Si_2H_6$ or a mixture thereof. The second wiring 58 may be cleaned using a plasma.

When the second wiring 58 may be readily reacted with silicon and silicon oxide, the metal barrier layer 56 including tantalum nitride remarkably restrict the chemical reaction.

EMBODIMENT 4

FIGS. 6A to 6I are cross sectional views illustrating a method for forming a wiring by a single damascene process according to a fourth embodiment of the present invention.

Figure 6A:
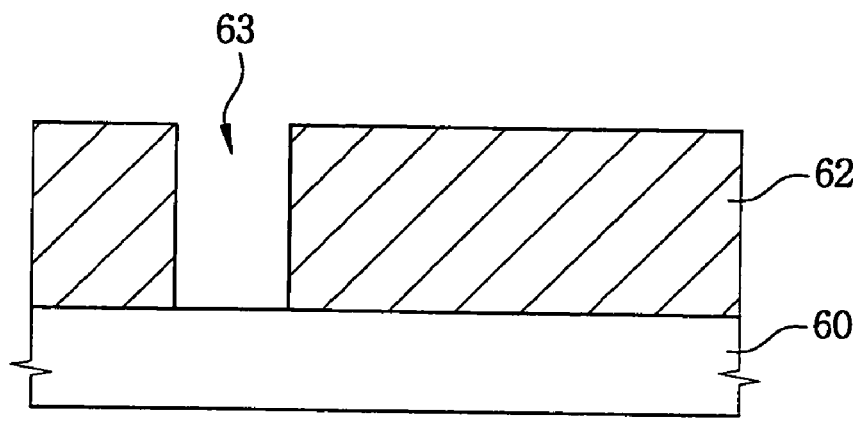
FIGS. 6A to 6I are cross sectional views illustrating a method for forming a wiring according to a fourth embodiment of the present invention.

Referring to FIG. 6A, a first insulating layer is formed on a substrate or a lower wiring 60. The first insulating layer is etched to form a first insulating layer pattern 62 having a contact hole or a via hole 63.

Figure 6B:
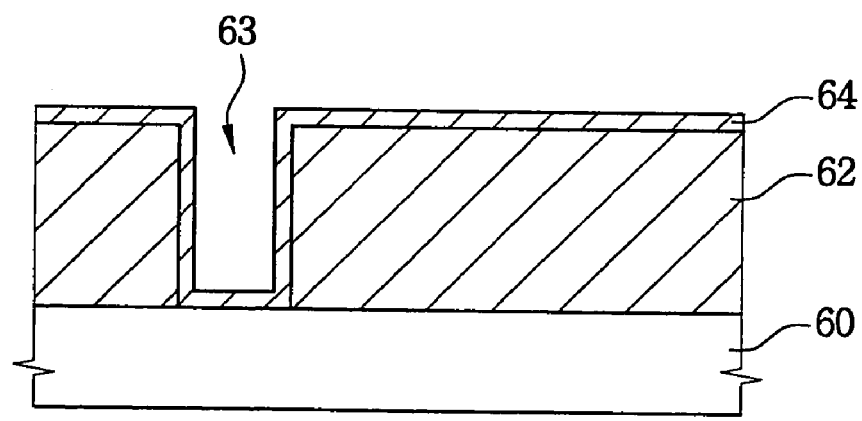

Referring to FIG. 6B, a first metal barrier layer 64 is formed on the first insulating layer pattern 62, and a side wall and a bottom face of the contact hole or the via hole 63. In particular, a source gas including $Ta(NC(CH_3)_2C_2H_5)(N(CH_3)_2)_3)$ and a reacting gas including $NH_3$ are concurrently introduced over the substrate 30 at a temperature of about 300° C. The $NH_3$ gas is introduced at a flow rate of 600 sccm. A gas mixed of $H_2$ having a flow rate of about 1,000 sccm and Ar having a flow rate of about 500 sccm is used as a purge gas. An Ar gas having a flow rate of about 100 sccm is used as a carrier gas of $Ta(NC(Ch_3)_2C_2H_5)(N(CH_3)_2)_3)$. As a result, the first metal barrier layer 64 includes tantalum nitride. The substrate 60 may be cleaned using a plasma before the formation of the first metal barrier layer 64.

Figure 6C:
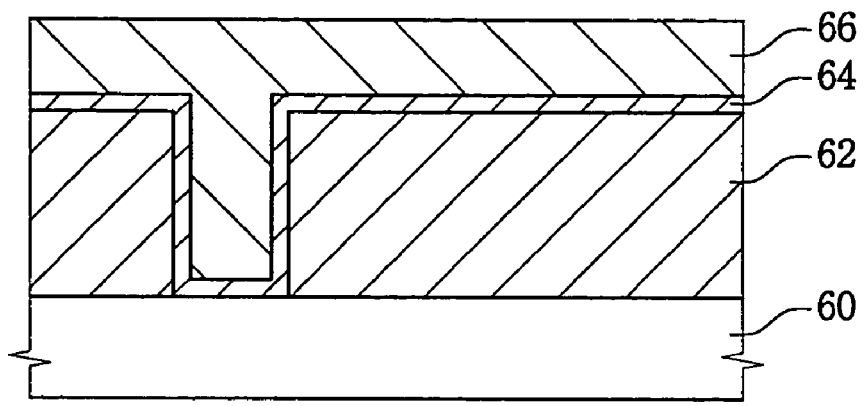

Referring to FIG. 6C, a first conductive layer 66 is formed on the first metal barrier layer 64 to fill the contact hole or the via hole 63. The first conductive layer 66 may include polysilicon, titanium, tantalum, aluminum, copper, tungsten, novel metal, metal nitride or a mixture thereof. Examples of the novel metal may include Ru, Pt or Ir. Examples of the metal nitride may include titanium nitride, tantalum nitride or tungsten nitride. The second wiring 58 may be [post] treated using an RF plasma to remove impurities remaining in the second wiring 58. The RF plasma may be generated through a remote plasma method or a direct plasma method that activates $H_2$, $NH_3$, $SiH_4$ or $Si_2H_6$ or a mixture thereof.

Figure 6D:
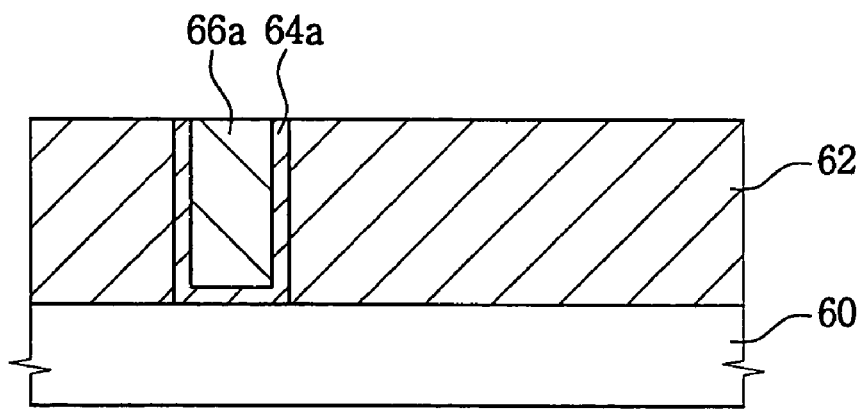

Referring to FIG. 6D, the first conductive layer 66 and the first metal barrier layer 64 are planarized by an etch back process or a CMP process for exposing the first insulating layer pattern 62 to form a first barrier layer pattern 64a and a contact plug 66a filling the contact hole 63.

Figure 6E:
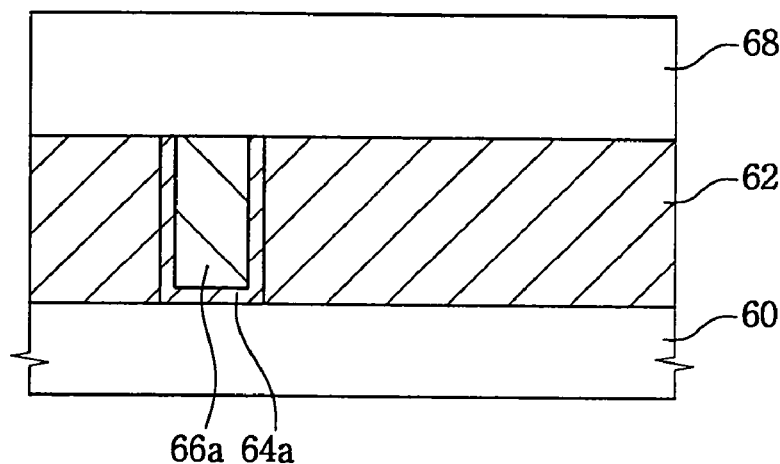

Referring to FIG. 6E, a second insulating layer 68 is formed on the first insulating layer pattern 62.

Figure 6F:
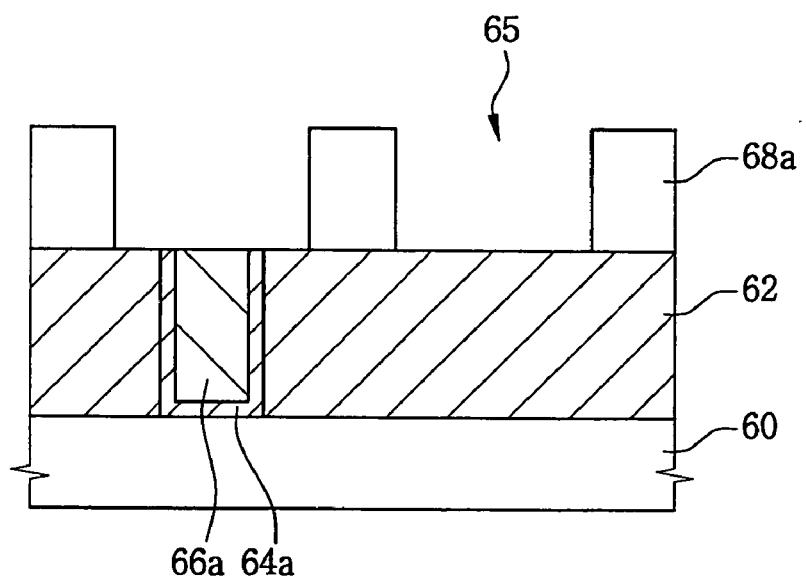

Referring to FIG. 6F, the second insulating layer 68 is etched to form a second insulating layer pattern 68a having a trench 65 through which the contact plug 66a is exposed.

Figure 6G:
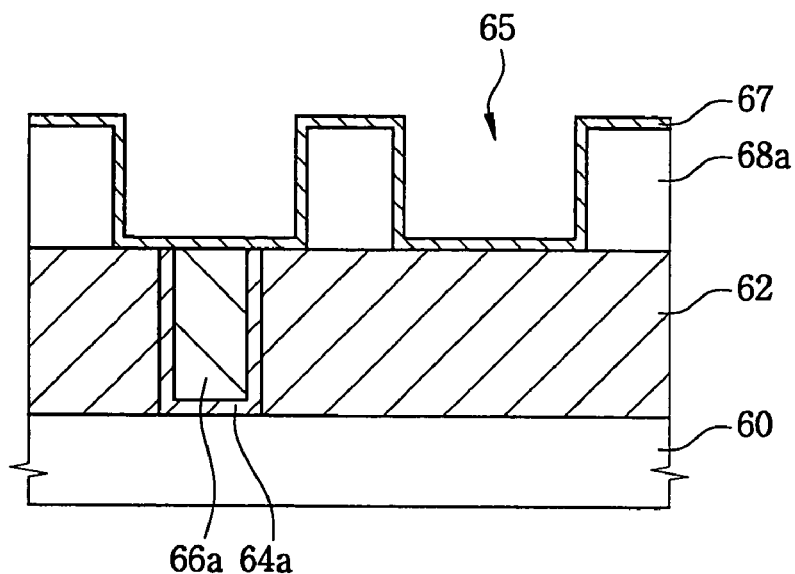

Referring to FIG. 6G, a second metal barrier layer 67 is formed on the second insulating layer pattern 62, and a side wall and a bottom face of the trench 65. The second metal barrier layer 67 is formed in the same manner used for forming the first metal barrier layer 64.

Figure 6H:
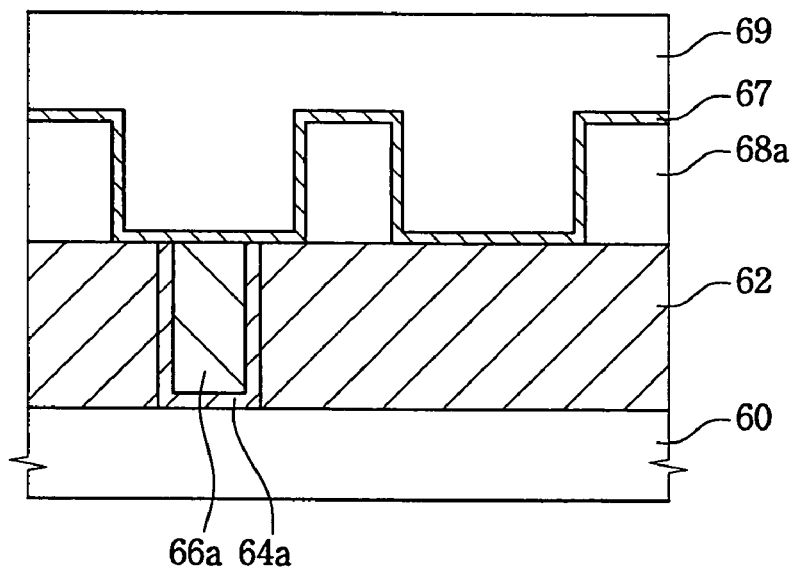

Referring to FIG. 6H, a second conductive layer 69 is formed on the second metal barrier layer 67 to fill the trench 65. The second conductive layer 69 is formed in the same manner used for forming the first conductive layer 66.

Figure 6I:
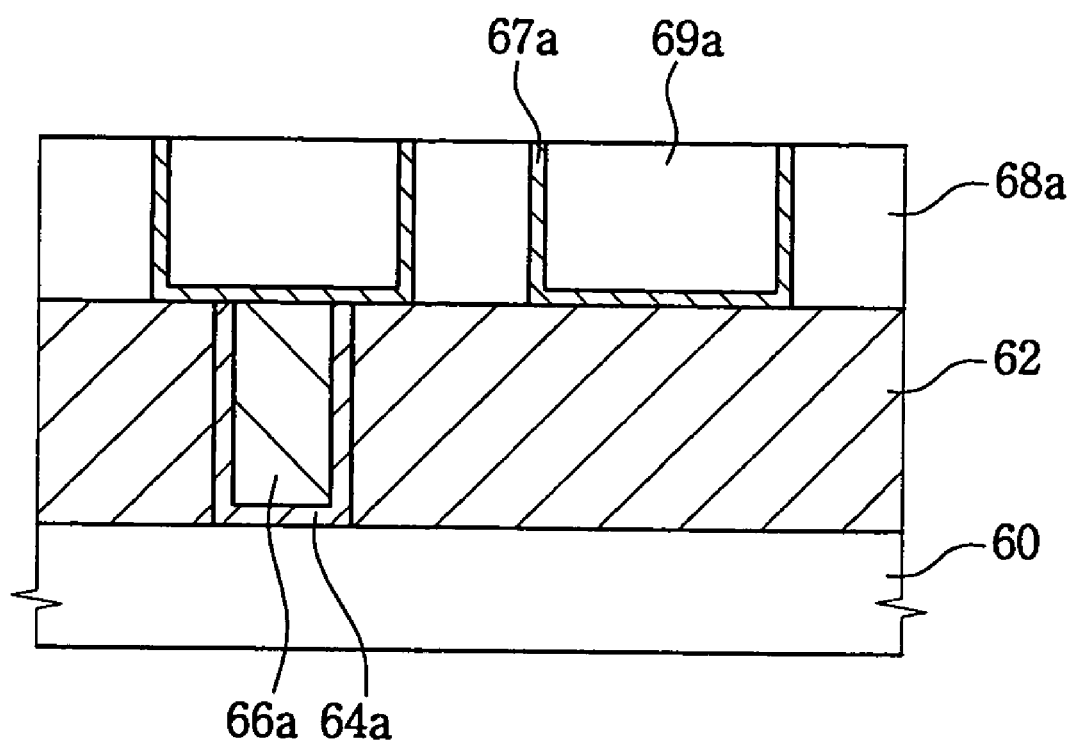

Referring to FIG. 6I, the second conductive layer 69 and the second metal barrier layer 67 are planarized by an etch back process or a CMP process for exposing the second insulating layer pattern 68a to form a second barrier layer pattern 67a and a wiring pattern 69a filling the trench 65.

When the contact plug 64a and the wiring pattern 69a may be readily reacted with silicon and silicon oxide, the first and second metal barrier layers 64 and 67 including tantalum nitride remarkably restrict the chemical reaction.

EMBODIMENT 5

FIGS. 7A to 7F are cross sectional views illustrating a method for forming a wiring by a dual damascene process according to a fifth embodiment of the present invention.

Figure 7A:
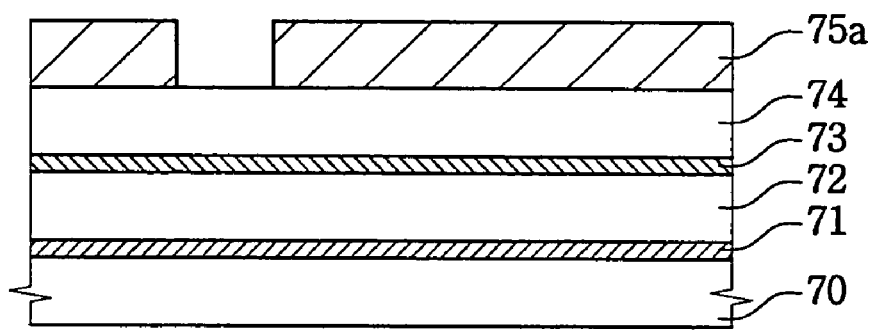
FIGS. 7A to 7F are cross sectional views illustrating a method for forming a wiring according to a fifth embodiment of the present invention.

Referring to FIG. 7A, a first nitride layer 71 is formed on a substrate or a lower wiring 70. A first insulating layer 72 is formed on the first nitride layer 71. A second nitride layer 73 is formed on the first insulating layer 72. A second insulating layer 74 is formed on the second nitride layer 73. A contact mask pattern 75a including photoresist is formed on the second insulating layer 74.

Figure 7B:
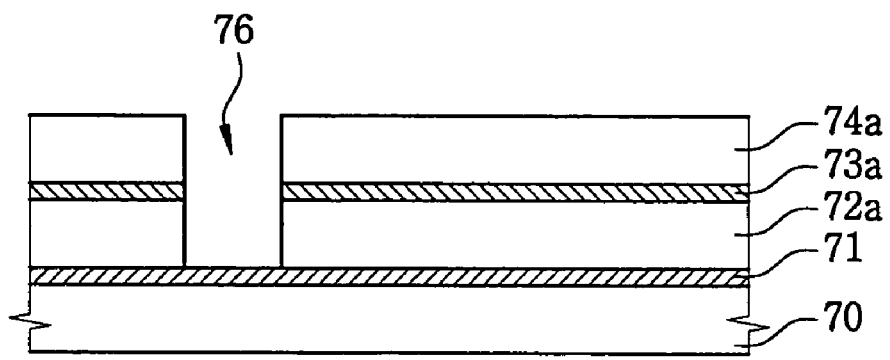

Referring to FIG. 7B, the second insulating layer 74, the second nitride layer 73 and the first insulating layer 72 are etched to form a second insulating layer pattern 74a, a second nitride pattern 73a and a first insulating layer pattern 72a having a preliminary via hole 76 through which the first nitride layer 71 is exposed.

Figure 7C:
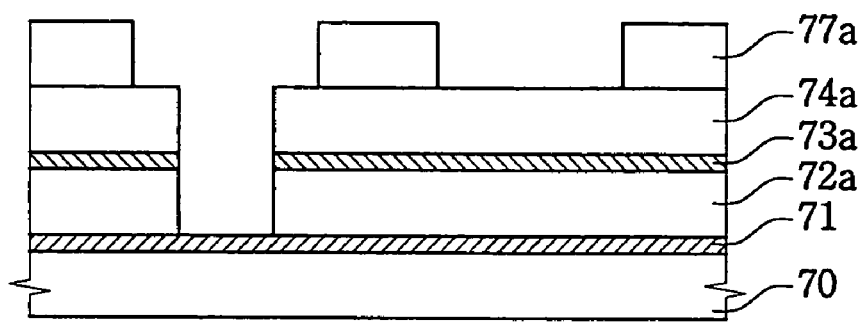

Referring to FIG. 7C, a trench mask 77a including photoresist is formed on the second insulating layer pattern 74a.

Figure 7D:
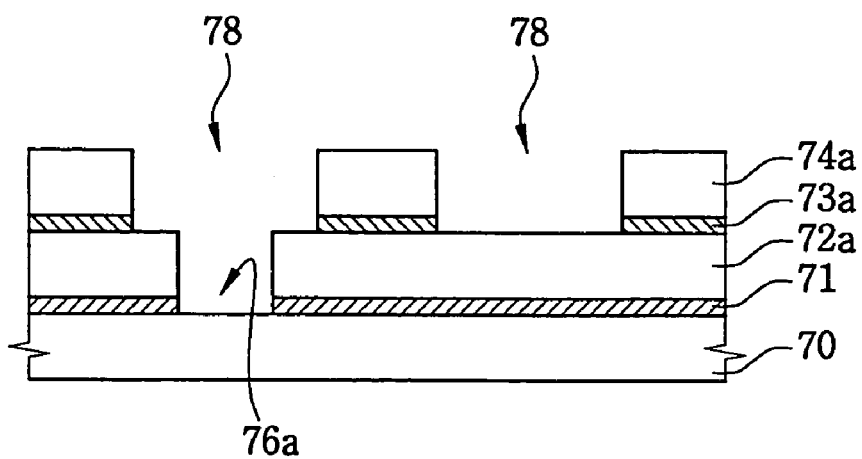

Referring to FIG. 7D, the second nitride layer pattern 74a is etched using the trench mask 77a as an etching mask for exposing the second nitride layer pattern 73a to form a trench 78 passing over the preliminary via hole 76. The first nitride layer 71 and the second nitride layer pattern 73a exposed through the trench 78 are partially etched to form a via hole 76a.

Figure 7E:
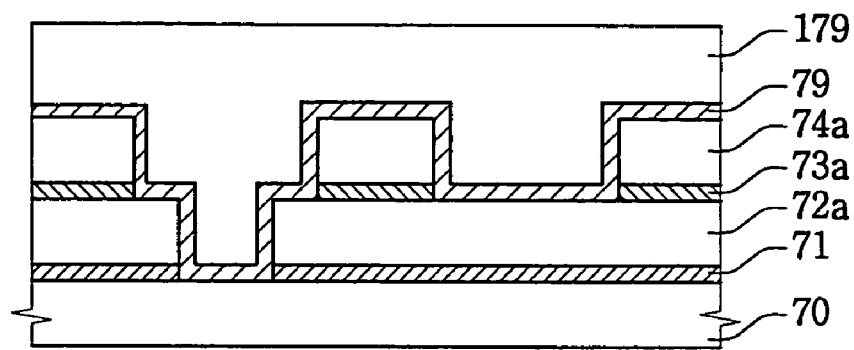

Referring to FIG. 7E, a metal barrier layer 79 is formed on a resultant structure. In particular, a source gas including $Ta(NC(CH_3)_2C_2H_5)(N(CH_3)_2)_3)$ and a reacting gas including $NH_3$ are simultaneously introduced over the substrate 70 at a temperature of about 300° C. The $NH_3$ gas is introduced at a flow rate of about 600 sccm. A gas mixed of $H_2$ having a flow rate of about 1,000 sccm and Ar having a flow rate of about 500 sccm is used as a purge gas. An Ar gas having a flow rate of about 100 sccm is used as a carrier gas of $Ta(NC(CH_3)_2C_2H_5)(N(CH_3)_2)_3)$. As a result, the metal barrier layer 79 includes tantalum nitride.

A wiring 179 is formed on the metal barrier layer 79. The wiring 179 may include polysilicon, titanium, tantalum, aluminum, copper, tungsten, novel metal, metal nitride or a mixture thereof. Examples of the novel metal may include Ru, Pt or Ir. Examples of the metal nitride may include titanium nitride, tantalum nitride or tungsten nitride.

Figure 7F:
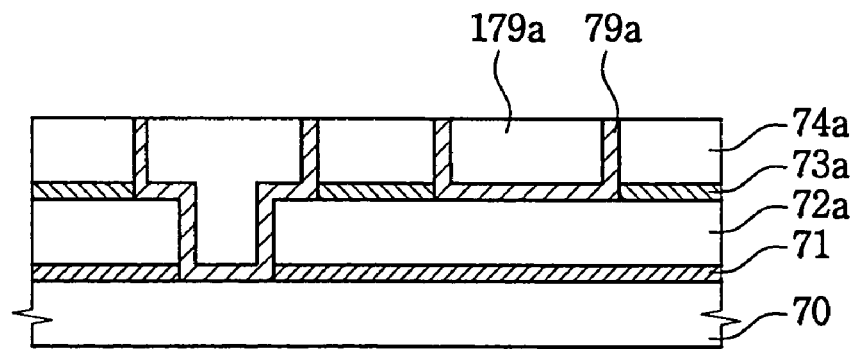

Referring to FIG. 7F, the wiring 179 is etched for exposing the second insulating layer pattern 74a to form a barrier layer pattern 79a and a wiring pattern 179a.

When the wiring pattern 179a may be readily reacted with silicon and silicon oxide, the barrier layer pattern 79a including tantalum nitride may remarkably restrict the chemical reaction.

Figure 8:
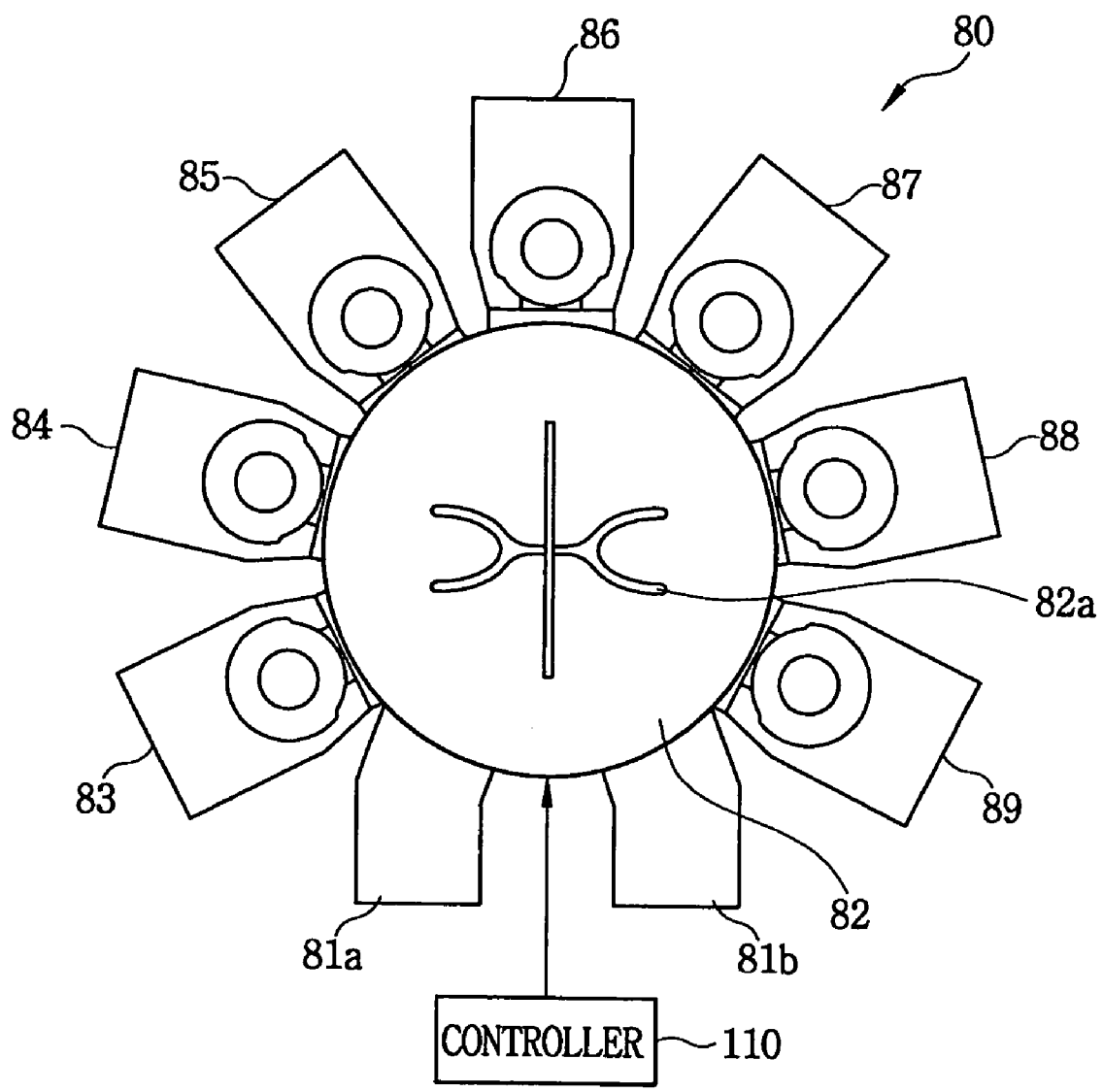
FIG. 8 is a cross sectional view illustrating an apparatus for forming a wiring according to an embodiment of the present invention.

Alternatively, this method may be employed in a process for forming a via plug that fills a via hole exposing a lower wiring, and as well as in the process for forming the wiring. FIG. 8 is a cross sectional view illustrating an apparatus for forming a wiring according to the present invention.

Referring to FIG. 8, an apparatus 80 for forming a wiring includes loadlock chambers 81a and 81b, a transfer chamber 82, a clean chamber 83, first to fourth process chambers 84, 85, 87 and 88, and a treatment chamber 86.

The loadlock chambers include a first loadlock chamber 81a for loading a substrate into the apparatus 80 and a second loadlock chamber 81b for unloading the substrate from the apparatus 80.

The loadlock chambers 81a and 81b are connected to the transfer chamber 82 for transferring the substrate. The transfer chamber 82 includes a transferring member 82a such as a robot arm for transporting the substrate.

The substrate is cleaned in the clean chamber 83 using a plasma. A metal barrier metal layer including tantalum or tantalum nitride is formed by a sputtering process in the first process chamber 84. A metal barrier layer including tantalum nitride is formed by a CVD process or an ALD process in the second process chamber 85. The metal barrier layer is treated using a plasma in the treatment chamber 86. A metal layer including copper is formed by a sputtering process in the third process chamber 87. A metal layer including copper is formed by a CVD process or an ALD process in the fourth process chamber 88.

The apparatus 80 has a cluster structure. Accordingly, the transfer chamber 82 is surrounded by the loadlock chambers 81a and 81b, the clean chamber 83, the first to fourth process chambers 84, 85, 87 and 88, and the treatment chamber 86.

The apparatus 80 includes a controller 110 for controlling transfer of the substrate. The controller 110 controls transfer of the substrate in accordance with a predetermined process. For example, when the predetermined process is a process according to embodiment 3, the controller 110 controls transportation of the substrate such that the substrate is only transported among the clean chamber 83, the second and fourth chambers 85 and 88, and the treatment chamber 86.

The apparatus 80 may form a desired metal layer by an in-situ process. Particularly, the apparatus 80 may be used in a process for forming a metal layer in which a sputtering process and an ALD process are performed through an in-situ type. For example, the substrate is cleaned using a plasma. A tantalum nitride layer is formed on the substrate using $Ta(NC(CH_3)_2C_2H_5)(N(CH_3)_2)_3)$ as a precursor by a CVD process or an ALD process. The tantalum nitride layer is treated using a plasma. A copper layer is formed on the tantalum nitride layer by a sputtering process, a CVD process or an ALD process.

EMBODIMENT 6

A wiring structure of a semiconductor device includes a tantalum nitride layer that has excellent chemical tolerance, an ability to function as a hard mask and a good etching selectivity relative to an insulating layer.

The wiring structure includes a diffusion preventing layer pattern, a conductive layer pattern and a reflection preventing layer pattern subsequently formed on a substrate. The wiring structure may further include an insulating interlayer interposed between the substrate and the diffusion preventing layer pattern. Additionally, the wiring structure may include an adhesive layer pattern including a titanium or tantalum interposed between the conductive layer pattern including aluminum or tungsten and the reflection preventing layer pattern including tantalum nitride. The wiring structure may further include an insulating interlayer covering the above patterns. A via hole may be formed through the insulating interlayer to expose the reflection preventing layer pattern.

The wiring structure may be formed on the substrate on which a diffusion preventing layer, a conductive layer and a reflection preventing layer are successively formed. The diffusion preventing layer, the conductive layer and the reflection preventing layer are patterned to form a wiring including the diffusion preventing layer pattern, the conductive layer pattern and the reflection preventing layer pattern.

An insulating layer may be interposed between the substrate and the diffusion preventing layer. An adhesive layer may be interposed between the conductive layer and the reflection preventing layer. Alternatively, the reflection preventing layer may be primarily patterned to form the reflection preventing layer pattern. The adhesive layer, the conductive layer and the diffusion preventing layer may be patterned using the refection preventing layer pattern as an etching mask to form an adhesive layer pattern, the conductive layer pattern and the diffusion preventing layer pattern.

The insulating interlayer is formed on the wiring. The insulating interlayer is etched to form a via hole exposing the reflection preventing layer pattern.

According to the method of the sixth embodiment, the tantalum nitride layer may have a strong chemical tolerance so that a ring defect may not occur in the tantalum nitride layer. The tantalum nitride layer may be also used as a hard mask because the tantalum nitride layer has a high etching selectivity relative to aluminum used for the conductive layer. When the via hole is formed through the insulating interlayer, the reflection preventing layer may be easily exposed through the via hole because the tantalum nitride layer has a high etching selectivity relative to the insulating interlayer. Accordingly, the tantalum nitride layer may have a thickness thinner than that of a conventional titanium nitride layer. As a result, the wiring may have a thin thickness so that spaces between the wirings may be completely filled with the insulating interlayer.

FIG. 9A to 9D are cross sectional views illustrating a method for forming a wiring according to a sixth embodiment of the present invention.

Figure 9A:
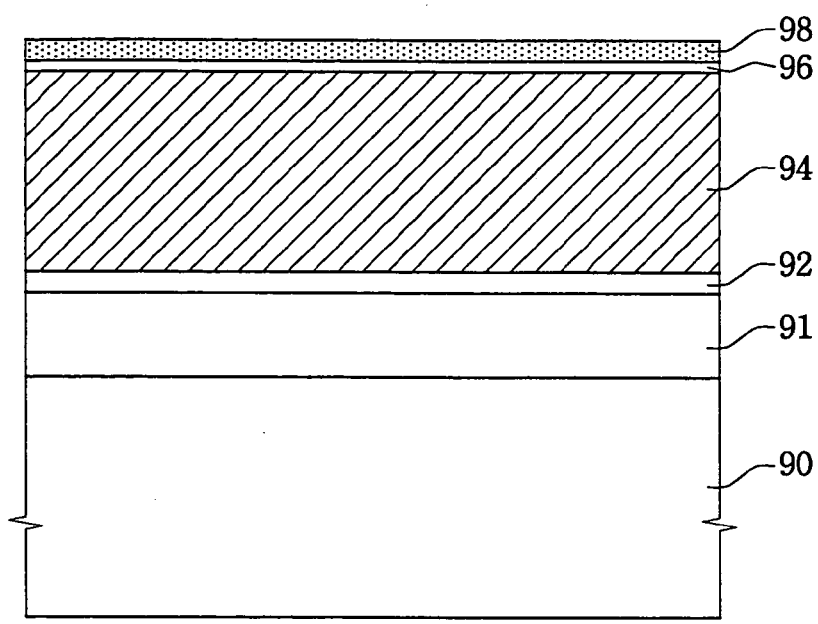
FIG. 9A to 9D are cross sectional views illustrating a method for forming a wiring according to a sixth embodiment of the present invention.

Referring to FIG. 9A, an insulating layer 91 is formed on a substrate 90. A diffusion preventing layer 92, a conductive layer 94, an adhesive layer 96 and a reflection preventing layer 98 are subsequently formed on the insulating layer 91. The diffusion preventing layer 92 may include a titanium layer, a titanium nitride layer or a titanium/titanium nitride layer. The conductive layer 94 may include aluminum or tungsten. The adhesive layer 96 may include titanium or tantalum.

When the conductive layer 94 includes aluminum and the adhesive layer 96 includes titanium, aluminum is reacted with titanium at an interface between the conductive layer 94 and the adhesive layer 96 to form a $TiAl_3$ compound. The $TiAl_3$ compound restricts migration of aluminum, thereby suppressing formation of grains on a surface of the conductive layer 94. The reflection preventing layer 98 including tantalum nitride has a thickness of about 50 Å to about 500 Å by a PVD process, a CVD process, a PECVD process, an ALD process or an RAALD process using a source gas including $Ta(NC(CH_3)_2C_2H_5)(N(CH_3)_2)_3)$ and a reacting gas including $H_2$, $N_2$, $NH_3$, $SiH_4$ or $Si_2H_6$. In particular, the source gas including $Ta(NC(CH_3)_2C_2H_5)(N(CH_3)_2)_3)$ and the reacting gas including $NH_3$ are simultaneously introduced over the substrate 90 at a temperature of about 300° C. The $NH_3$ gas is introduced at a flow rate of 600 sccm. A gas mixed of $H_2$ having a flow rate of about 1,000 sccm and Ar having a flow rate of about 500 sccm is used as a purge gas. An Ar gas having a flow rate of about 100 sccm is used as a carrier gas of $Ta(NC(CH_3)_2C_2H_5)(N(CH_3)_2)_3)$.

Figure 9B:
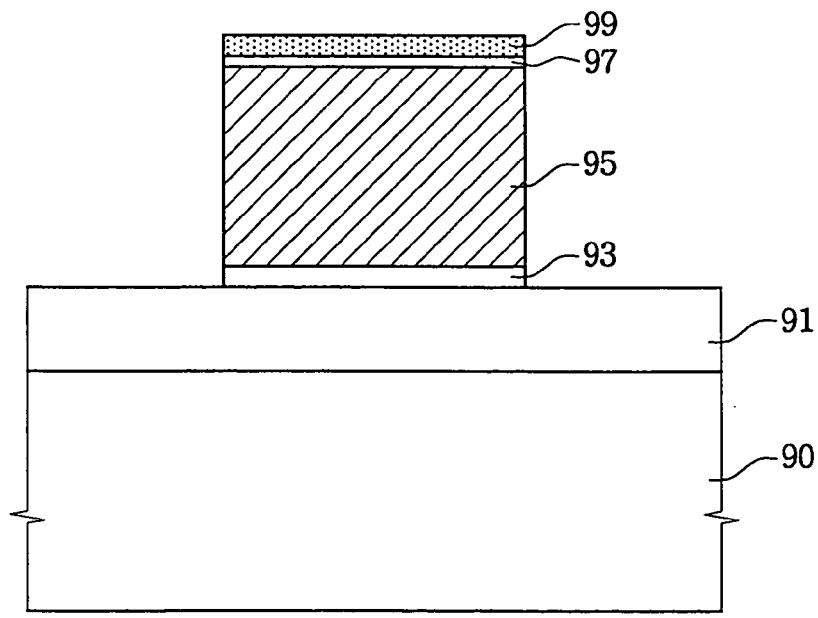

Referring to FIG. 9B, the reflection preventing layer 98, the adhesive layer 96, the conductive layer 94 and the diffusion preventing layer 92 are patterned using a photoresist pattern as an etching mask to form a wiring structure including a diffusion preventing layer pattern 93, a conductive layer pattern 95, an adhesive layer pattern 96 and a reflection preventing layer pattern 99. Alternatively, the reflection preventing layer 98 may be primarily patterned to form the reflection preventing layer pattern 99. The adhesive layer 96, the conductive layer 94 and the diffusion preventing layer 92 may be patterned using the reflection preventing layer pattern 99 as an etching mask to form the diffusion preventing layer pattern 93, the conductive layer pattern 95 and the adhesive layer pattern 96. The reflection preventing layer pattern 99 including tantalum nitride may be used as the etching mask because tantalum nitride has an etching selectivity of about seven times greater than titanium nitride. The tantalum nitride layer also has a strong chemical tolerance so that a ring defect may not occur in the tantalum nitride layer.

Figure 9C:
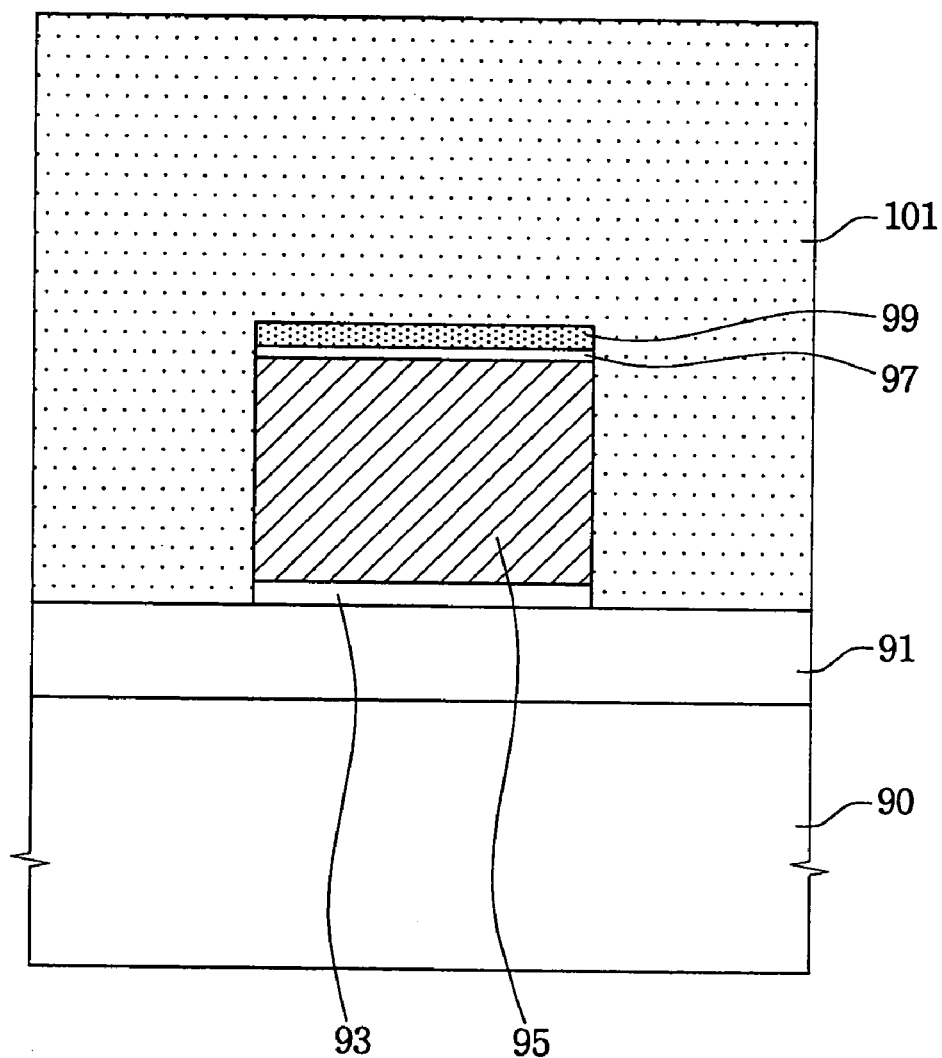

Referring to FIG. 9C, the wiring structure is covered by an insulating interlayer 101 including oxide. Since the reflection preventing layer pattern 99 including tantalum nitride has a thickness thinner than that of a titanium nitride layer, the wiring structure also has a thin thickness. As a result, a space between the wirings may be completely filled with the insulating interlayer 101.

Figure 9D:
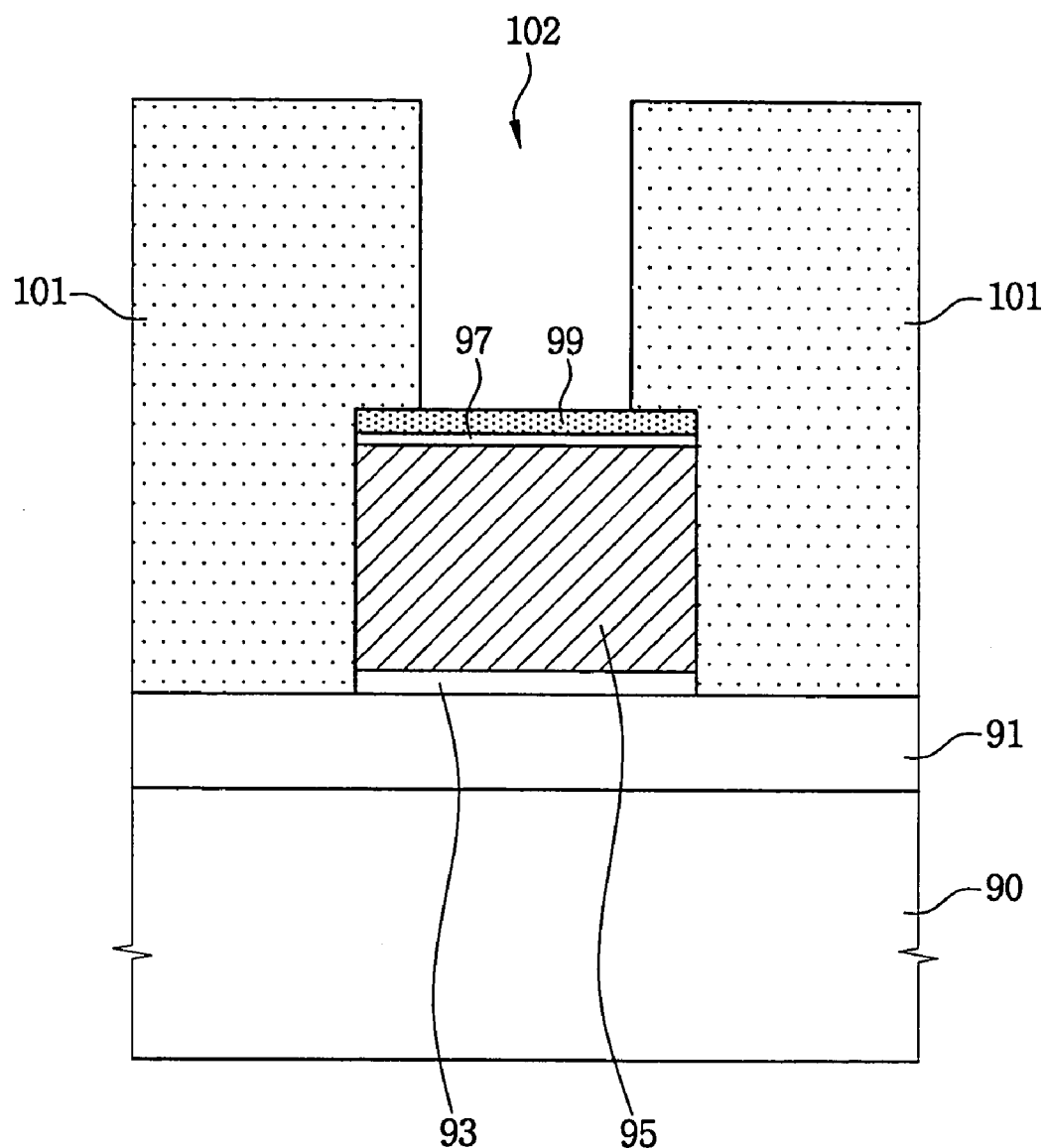

Referring to FIG. 9D, the insulating interlayer 101 is etched to form a via hole 102 exposing the reflection preventing layer pattern 99. Here, since tantalum nitride has an etching rate slower than oxide, the reflection preventing layer pattern 99 may be easily exposed through the via hole 102.

Results of experiments that were carried out on various wirings formed through the method of the present invention were showed in FIGS. 10 to 14.

EXAMPLE 1

Figure 10:
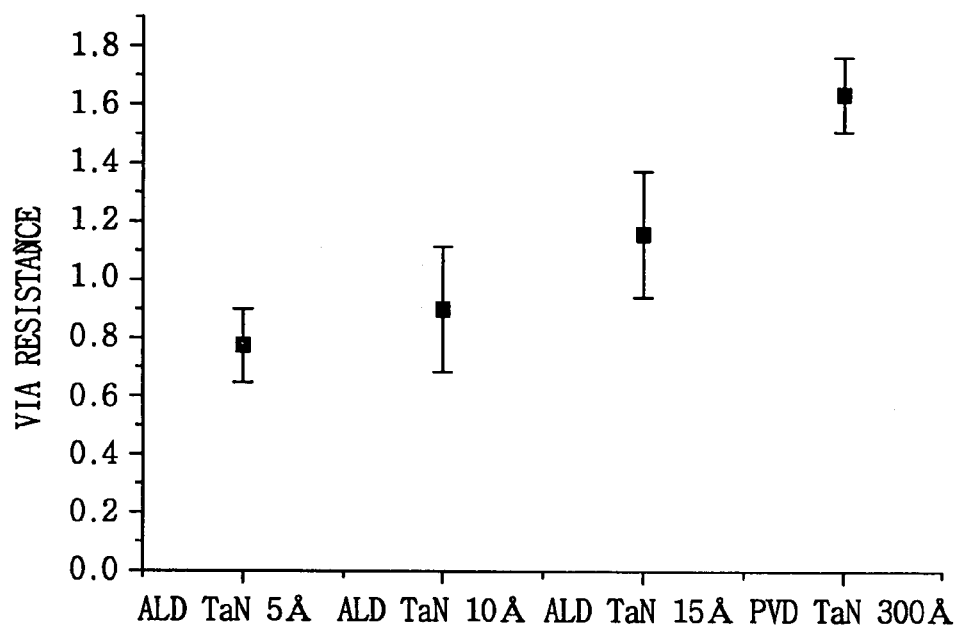
FIGS. 10 to 14 are graphs showing electrical characteristics between a wiring of the present invention and a wiring of the conventional method.

A via resistance of a semiconductor device having a Kelvin structure that included a single via formed between lower and upper wirings was shown in FIG. 10.

A tantalum nitride layer having a thickness of about 300 Å was formed on a substrate by a conventional PVD process. On the contrary, a first tantalum nitride layer having a thickness of about 5 Å was formed on a substrate by an ALD process in accordance with the method of the present invention. A second tantalum nitride layer having a thickness of about 10 Å was formed on a substrate by an ALD process in accordance with the method of the present invention. A third tantalum nitride layer having a thickness of about 15 Å was formed on a substrate by an ALD process in accordance with the method of the present invention. The four substrates had via holes having a diameter of about 0.13 μm, respectively.

As shown in FIG. 10, the tantalum nitride layers formed by the method of the present invention had thickness thinner than that formed by the conventional method. It could be noted that the tantalum nitride layers formed by the method of the present invention had via resistances lower than that formed by the conventional method. Further, it could be also noted that the tantalum nitride layer had a low via resistance inversely proportional to the thickness of the tantalum nitride layer.

EXAMPLE 2

Figure 11:
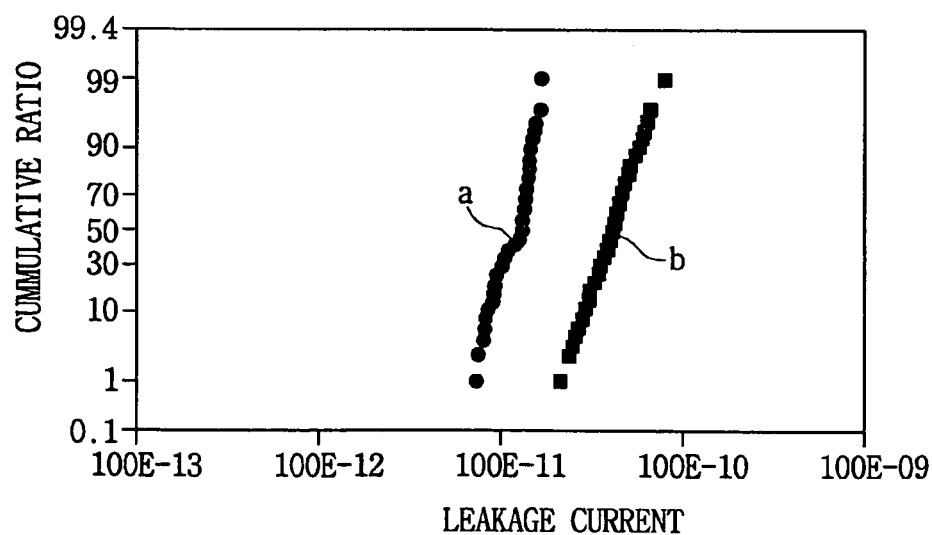

A characteristic of leakage currents in a semiconductor device having a single damascene comb structure that included a trench filled with wirings was shown in FIG. 11. The wirings had a length of about 3.6 meters, a width of about 0.141 μm and an interval therebetween of about 0.14 mm. In FIG. 11, a lateral axis represented a leakage current and a longitudinal axis represented a cumulative probability.

A tantalum nitride layer having a thickness of about 300 Å was formed on a substrate by a conventional PVD process, whereas, a tantalum nitride layer having a thickness of about 10 Å was formed on a substrate by an ALD process in accordance with the method of the present invention. In FIG. 11, line a indicates the characteristic of leakage current of the tantalum nitride layer formed by the conventional method. Line b indicates the characteristic of leakage current of the tantalum nitride layer formed by the method of the present invention. As shown in FIG. 11, it could be noted that the tantalum nitride layer formed by the method of the present invention had characteristic of leakage current more enhanced than that formed by the conventional method.

EXAMPLE 3

Figure 12:
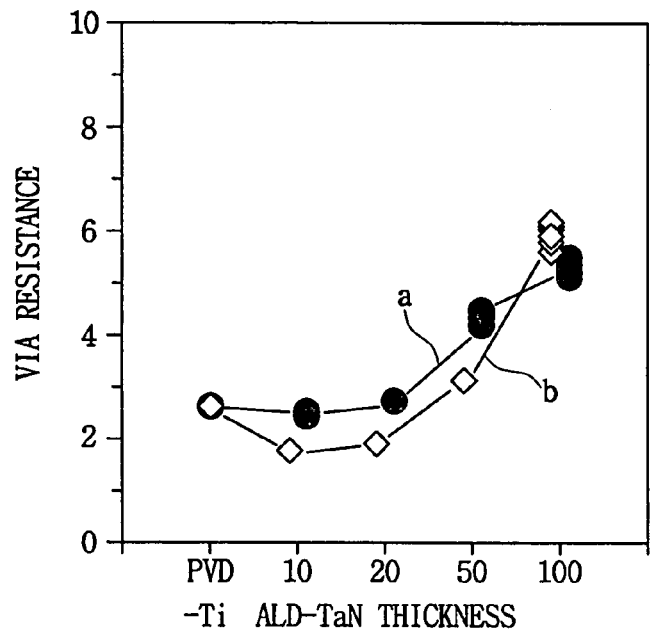

A via resistance of tantalum nitride barrier layers was shown in FIG. 12. A via plug had a critical dimension of about 0.26 mm and an aspect ratio of about 3.1:1. In FIG. 12, [a]line a indicates a via resistance of a tantalum nitride layer when $((Net_2)_3Ta=NtBu)$ was used as a precursor. Line b indicates a via resistance of a tantalum nitride layer when $Ta(NC(Ch_3)_2C_2H_5)(N(CH_3)_2)_3)$ was used as a precursor. Aluminum layers were formed on the tantalum nitride barrier layers, respectively.

As shown in FIG. 12, the via resistance was directly proportional to a thickness of the tantalum nitride barrier layer. It could be noted that the tantalum nitride barrier layer formed using $Ta(NC(Ch_3)_2C_2H_5)(N(CH_3)_2)_3)$ as the precursor had a via resistance lower than that formed using $((Net_2)_3Ta=NtBu)$ as the precursor.

EXAMPLE 4

Figure 13:
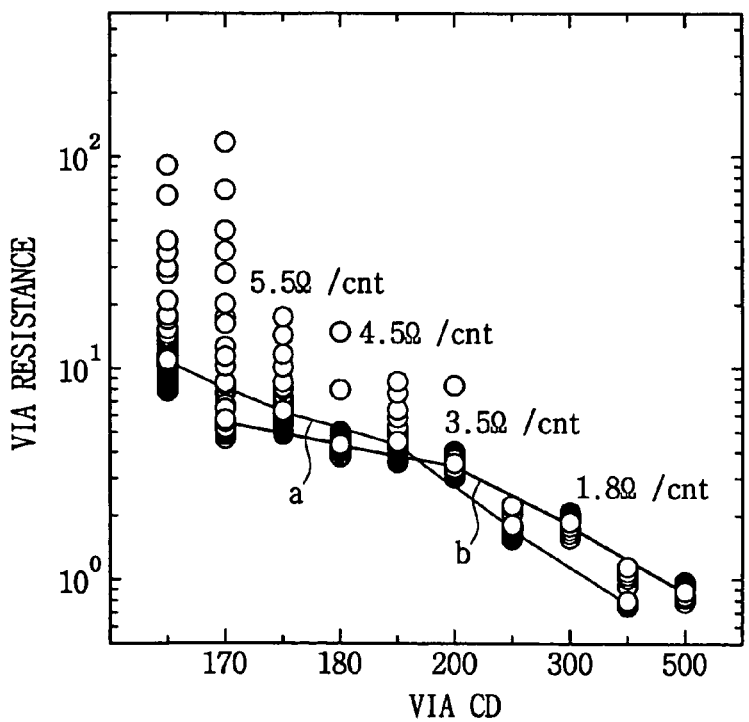

Via resistance of tantalum nitride barrier layers formed by a single damascene process in accordance with the method of the fourth embodiment was shown in FIG. 13.

A tantalum nitride layer having a thickness of about 450 Å was formed on a substrate by a conventional PVD process. A copper layer was formed on the tantalum nitride layer by an in-situ process. Whereas, a tantalum nitride layer having a thickness of about 10 Å was formed on a substrate by an ALD process in accordance with the method of the present invention. A copper layer was formed on the tantalum nitride layer.

In FIG. 13, line a indicates a via resistance of the tantalum nitride layer formed by the conventional method. Line b indicates a via resistance of the tantalum nitride layer formed by the method of the present invention. When a via plug had a critical dimension of below about 200 nm, the tantalum nitride layer formed by the method of the present invention had a via resistance lower than that formed by the conventional method. On the contrary, when a via plug had a critical dimension of above about 200 nm, the tantalum nitride layer formed by the method of the present invention had a via resistance higher than that formed by the conventional method. It should, however, be noted that the method of the present invention were advantageously employed in processes for fabricating a semiconductor device considering the thickness of the tantalum nitride layer formed by the method of the present invention thinner than that of the tantalum nitride layer formed by the conventional method.

EXAMPLE 5

Figure 14:
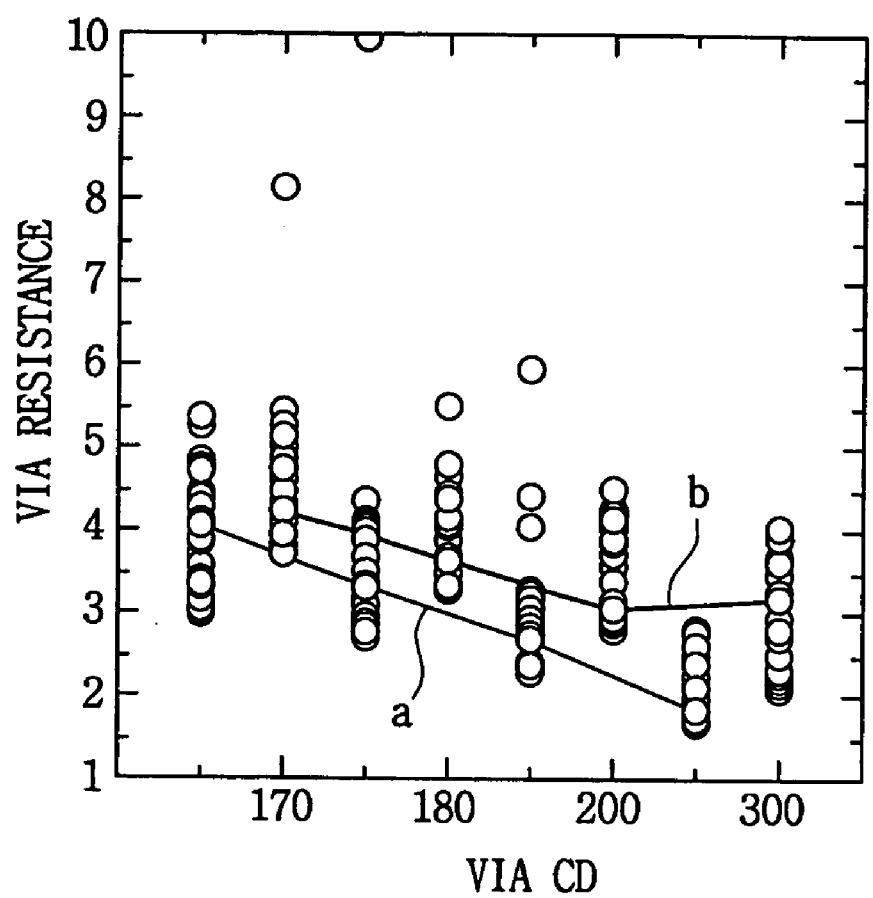

Via resistance of tantalum nitride barrier layers formed by a dual damascene process in accordance with the method of the fifth embodiment was shown in FIG. 14.

A tantalum nitride layer having a thickness of about 100 Å was formed on a substrate by a conventional PVD process. A tantalum layer having a thickness of about 250 Å was formed on the tantalum nitride layer. A copper layer was formed on the tantalum layer by an in-situ process. Whereas, a tantalum nitride layer having a thickness of about 20 Å was formed on a substrate by an ALD process in accordance with the method of the present invention. A copper layer was formed on the tantalum nitride layer.

In FIG. 14, line a indicates a via resistance of the tantalum nitride layer formed by the conventional method. Line b indicates a via resistance of the tantalum nitride layer formed by the method of the present invention. It could be noted that the tantalum nitride layer formed by the method of the present invention had a thickness thinner than and a via resistance lower than that formed by the conventional method.

According to the present invention, a deposition process is performed using a new tantalum precursor so that a wiring having improved step coverage and gap-filling characteristic may be rapidly formed.

Furthermore, a ring defect may be not generated in a tantalum nitride layer formed by the method of the present invention so that an additional process for forming an oxide layer pattern may be unnecessary. As a result, an improved semiconductor device may be fabricated according to present invention.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention outlined by the appended claims.

What is claimed is:

1. A method for forming a wiring of a semiconductor device, the method comprising:
   a) forming an first insulating interlayer on a substrate;
   b) introducing tantalum amine derivatives onto the first insulating interlayer, the tantalum amine derivatives comprising $Ta(NC(CH_3)_2C_2H_5)(N(CH_3)_2)_3)$;
   c) chemisorbing a portion of the tantalum amine derivatives on a surface of the first insulating interlayer;
   d) removing non-chemisorbed tantalum amine derivatives from the surface of the first insulating interlayer;
   e) introducing a reacting gas onto the first insulating interlayer; and
   f) removing a ligand in the tantalum amine derivatives chemisorbed on the first insulating interlayer from the tantalum amine derivatives.

2. The method of claim 1, wherein removing a ligand is performed by a chemical reaction between the reacting gas and the ligand to form a solid material including tantalum nitride.

3. The method of claim 1, further comprising:
   g) accumulating the solid material on the surface of the first insulating interlayer through repeating the acts of b) to f) to form a first wiring.

4. The method of claim 3, wherein the solid material is accumulated by a thermal atomic layer deposition (ALD) process or a radical assisted atomic layer deposition (ALD) process.

5. The method of claim 1, wherein the tantalum amine derivatives and the reacting gas non-chemisorbed on the surface of the first insulating interlayer are removed using an inert gas comprising argon (Ar), helium (He) or nitrogen ($N_2$).

6. The method of claim 1, wherein the reacting gas comprises $H_2$, $NH_3$, $SiH_4$ or $Si_2H_6$.

7. The method of claim 6, wherein the reacting gas is activated by a remote plasma.

8. The method of claim 1, wherein the steps of b) to f) are performed at a temperature of about 100° C. to about 350° C.

9. The method of claim 3, further comprising forming a contact hole through the first insulating interlayer to expose a region of the substrate.

10. The method of claim 9, further comprising forming a novel metal layer including titanium, tantalum and a novel metal on the first insulating interlayer having the contact hole.

11. The method of claim 9, wherein the solid material comprises a contact plug that fills the contact hole.

12. The method of claim 3, further comprising forming a second wiring on the first wiring.

13. The method of claim 12, wherein the second wiring comprises titanium, tantalum, aluminum, copper, tungsten, a novel metal or a metal nitride.

14. The method of claim 13, wherein the novel metal includes ruthenium (Ru), platinum (Pt) or iridium (Ir).

15. The method of claim 13, wherein the metal nitride comprises titanium nitride, tantalum nitride or tungsten nitride.

16. The method of claim 3, wherein a contact hole is formed through the first insulating interlayer to expose a region of the substrate, and wherein the solid material includes a metal barrier layer formed on the surface of the first insulating interlayer, and a side wall and a bottom face of the contact hole.

17. The method of claim 16, further comprising forming a second wiring including titanium, tantalum, aluminum, copper, tungsten, a novel metal or a metal nitride on the metal barrier layer.

18. The method of claim 3, wherein a via hole is formed through the first insulating interlayer to expose a lower wiring, wherein the solid material includes a first metal barrier layer formed on a side wall and a bottom face of the via hole, wherein a first metal layer is formed on the first metal barrier layer to fill the via hole, and wherein the first metal layer is planarized for exposing the first insulating interlayer to form a via plug filling the via hole.

19. The method of claim 18, further comprising:
forming a second insulating interlayer on the first insulating interlayer;
forming a trench through the second insulating interlayer to expose the via plug;
forming a second metal barrier layer including a solid material on a side wall and a bottom face of the trench;
forming a second metal layer on the second metal barrier layer to fill the trench; and
planarizing the second metal layer to expose the second insulating interlayer to form a second wiring that fills the trench.

20. The method of claim 3, further comprising:
forming a preliminary via hole through the first insulating interlayer to expose a region of the substrate or a lower wiring; and
forming a trench and a via hole passing over the preliminary via hole through the first insulating interlayer,
wherein the solid material includes a diffusion preventing layer formed on a side wall and a bottom face of the trench and the via hole, respectively.

21. The method of claim 20, further comprising:
forming a metal layer in the trench and the via hole; and
planarizing the metal layer to expose the first insulating interlayer to form a via plug that fills the via hole and a second wiring that fills the trench.

22. The method of claim 3, further comprising treating the first wiring using any one of $H_2$, $N_2$, $NH_3$, $SiH_4$, $Si_2H_6$ or a mixture thereof that is activated by a remote plasma or direct plasma.

23. The method of claim 3, which further comprises forming a layer including titanium, tantalum or a novel metal on the first wiring.

24. The method of claim 3, further comprising treating the solid material using any one of $H_2$, $N_2$, $NH_3$, $SiH_4$, $Si_2H_6$ or a mixture thereof that is activated by a remote plasma or direct plasma.

25. A method for forming a wiring of a semiconductor device comprising:
a) forming an insulating layer a substrate;
b) introducing tantalum amine derivatives onto the insulating layer, the tantalum amine derivatives comprising $Ta(NC(CH_3)_2C_2H_5)(N(CH_3)_2)_3)$ and a reacting gas selected from the group consisting of $H_2$, $NH_3$, $SiH_4$, and $Si_2H_6$; and
c) depositing the tantalum amine derivatives and the reacting gas on the insulating layer to form a wiring including tantalum nitride.

26. The method of claim 25, wherein the reacting gas is mixed with an inert gas comprising argon (Ar), helium (He) or nitrogen (N2).

27. The method of claim 25, which further comprises treating the wiring using any one of $H_2$, $N_2$, $NH_3$, $SiH_4$, $Si_2H_6$ or a mixture thereof that is activated by a remote plasma or direct plasma.

28. A method for forming a metal layer of a semiconductor device comprising:
cleaning a substrate using a plasma;
introducing tantalum amine derivatives onto the substrate, the tantalum amine derivatives comprising $Ta(NC(CH_3)_2C_2H_5)(N(CH_3)_2)_3)$ and a reacting gas selected from the group consisting of $H_2$, $NH_3$, $SiH_4$, and $Si_2H_6$;
depositing the tantalum amine derivatives and the reacting gas on the substrate to form a first metal layer including tantalum nitride;
treating the first metal layer using a plasma; and
forming a second metal layer including copper on the first metal layer by a sputtering process, a chemical vapor deposition (CVD) process or an atomic layer deposition (ALD) process.

29. A method for forming a wiring of a semiconductor device comprising:
a) forming a conductive layer on a substrate;
b) introducing tantalum amine derivatives onto a surface of the conductive layer, the tantalum amine derivatives comprising $Ta(NC(CH_3)_2C_2H_5)(N(CH_3)_2)_3)$ thereby chemisorbing a portion of the tantalum amine derivatives on the surface of the conductive layer;
c) removing non-chemisorbed tantalum amine derivatives from the surface of the conductive layer;
d) introducing a reacting gas over the substrate to remove a ligand in the tantalum amine derivatives chemisorbed on the surface of the conductive layer from the tantalum amine derivatives by a chemical reaction between the reacting gas and the ligand to form a solid material including tantalum nitride; and
e) accumulating the solid material on the conductive layer through repeating the steps of b) to d) to form a wiring.

30. The method of claim 29, wherein the solid material is accumulated by a thermal atomic layer deposition (ALD) process or a radical assisted atomic layer deposition (ALD) process.

31. The method of claim 29, wherein the tantalum amine derivatives and the reacting gas non-chemisorbed on the surface of the conductive layer are removed using an inert gas including argon (Ar), helium (He) and nitrogen ($N_2$).

32. The method of claim 29, wherein the reacting gas comprises $H_2$, $NH_3$, $SiH_4$ or $Si_2H_6$.

33. The method of claim 32, wherein the reacting gas is activated by a remote plasma.

34. The method of claim 29, wherein the acts of b) to d) are performed at a temperature of about 100° C. to about 450° C.

35. The method of claim 29, further comprising forming an adhesive layer on the conductive layer.

36. The method of claim 35, wherein the adhesive layer comprises titanium or tantalum.

37. The method of claim 29, wherein the conductive layer comprises aluminum or tungsten.

38. The method of claim 29, wherein the wiring comprises a reflection preventing layer.

39. The method of claim 29, further comprising:
    forming an insulating layer on the wiring; and
    etching the insulating layer to form a via hole exposing the wiring.

40. The method of claim 29, further comprising:
    etching the wiring to form a wiring pattern; and
    etching the conductive layer using the wiring pattern as a mask to form a conductive layer pattern.

41. A method for forming a wiring of a semiconductor device comprising:
    a) forming a conductive layer on a substrate;
    b) introducing tantalum amine derivatives onto the conductive layer, the tantalum amine derivatives comprising $Ta(NC(CH_3)_2C_2H_5)(N(CH_3)_2)_3)$ and a reacting gas selected from the group consisting of $H_2$, $NH_3$, $SiH_4$, and $Si_2H_6$; and
    c) depositing the tantalum amine derivatives and the reacting gas on the conductive layer to form a wiring including tantalum nitride.

42. The method of claim 41, further comprising forming an adhesive layer on the conductive layer.

43. The method of claim 42, wherein the adhesive layer comprises titanium or tantalum.

44. The method of claim 41, wherein the conductive layer comprises aluminum or tungsten.

45. The method of claim 41, wherein the wiring comprises a reflection preventing layer.

46. The method of claim 41, further comprising:
    forming an insulating layer on the wiring; and
    etching the insulating layer to form a via hole exposing the wiring.

47. The method of claim 41, further comprising:
    etching the wiring to form a wiring pattern; and
    etching the conductive layer using the wiring pattern as a mask to form a conductive layer pattern.

48. A method for forming a metal layer of a semiconductor device comprising:
    forming an insulating layer on a substrate;
    forming a contact hole or a via hole and a trench through the insulating layer;
    introducing tantalum amine derivatives comprising $Ta(NC(CH_3)_2C_2H_5)(N(CH_3)_2)_3)$ and a reacting gas selected from the group consisting of $H_2$, $NH_3$, $SiH_4$, and $Si_2H_6$ onto the insulating layer;
    depositing the tantalum amine derivatives and the reacting gas on an inner wall of the contact hole or the via hole and the trench to form a barrier layer including tantalum nitride; and
    filling the contact hole or the via hole and the trench with a metal layer.

49. The method of claim 48, further comprising planarizing the metal layer to expose the insulating layer.

50. A method for forming a metal layer of a semiconductor device comprising:
    forming an first insulating layer on a substrate;
    forming a contact hole or a via hole through the first insulating layer;
    introducing tantalum amine derivatives comprising $Ta(NC(CH_3)_2C_2H_5)(N(CH_{32})_3)$ and a reacting gas selected from the group consisting of $H_2$, $NH_3$, $SiH_4$, and $Si_2H_6$ onto the first insulating layer;
    depositing the tantalum amine derivatives and the reacting gas on an inner wall of the contact hole or the via hole to form a first barrier layer including tantalum nitride; and
    filling the contact hole or the via hole with a first metal layer.

51. The method of claim 50, further comprising planarizing the first metal layer for exposing the first insulating layer to form a via plug.

52. The method of claim 51, further comprising:
    forming an second insulating layer on the first insulating layer;
    forming a trench through the second insulating layer;
    introducing tantalum amine derivatives comprising $Ta(NR_1)(NR_2R_3)_3$ in which $R_1$, $R_2$ and $R_3$ are H or $C_1$–$C_6$ alkyl group and a reacting gas selected from the group consisting of $H_2$, $NH_3$, $SiH_4$, and $Si_2H_6$ onto the second insulating layer;
    depositing the tantalum amine derivatives and the reacting gas on an inner wall of the trench to form a second barrier layer including tantalum nitride; and
    filling the trench with a second metal layer.

53. The method of claim 52, further comprising planarizing the second metal layer for exposing the second insulating layer to form a wiring.

* * * * *

UNITED STATES PATENT AND TRADEMARK OFFICE
CERTIFICATE OF CORRECTION

PATENT NO. : 7,105,444 B2
APPLICATION NO. : 10/857253
DATED : September 12, 2006
INVENTOR(S) : Kyung-In Choi et al.

Page 1 of 1

It is certified that error appears in the above-identified patent and that said Letters Patent is hereby corrected as shown below:

Column 4, lines 16-17, the word "400μm" should read -- 400μΩm --;

Column 24, line 20, the word "Ta(NC(CH$_3$)$_2$C$_2$H$_5$)(N(CH$_{32}$)$_3$)" should read -- Ta(NC(CH$_3$)$_2$C$_2$H$_5$)(N(CH$_3$)$_2$)$_3$) --.

Signed and Sealed this

Eighteenth Day of August, 2009

David J. Kappos
*Director of the United States Patent and Trademark Office*